US009252001B2

(12) United States Patent
Sawada et al.

(10) Patent No.: US 9,252,001 B2
(45) Date of Patent: Feb. 2, 2016

(54) PLASMA PROCESSING APPARATUS, PLASMA PROCESSING METHOD AND STORAGE MEDIUM

(71) Applicant: TOKYO ELECTRON LIMITED, Tokyo (JP)

(72) Inventors: Ikuo Sawada, Nirasaki (JP); Peter Ventzek, Nirasaki (JP); Tatsuro Ohshita, Nirasaki (JP); Kazuyoshi Matsuzaki, Nirasaki (JP); Songyun Kang, Amagasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 192 days.

(21) Appl. No.: 14/164,564

(22) Filed: Jan. 27, 2014

(65) Prior Publication Data

US 2014/0138356 A1    May 22, 2014

Related U.S. Application Data

(62) Division of application No. 12/523,212, filed as application No. PCT/JP2007/075076 on Dec. 27, 2007, now Pat. No. 8,636,871.

(30) Foreign Application Priority Data

Jan. 15, 2007    (JP) .................................. 2007-006206

(51) Int. Cl.
    *H01J 37/32*    (2006.01)
(52) U.S. Cl.
    CPC ....... *H01J 37/32568* (2013.01); *H01J 37/3244* (2013.01); *H01J 37/32082* (2013.01); *H01J 37/32091* (2013.01); *H01J 37/32522* (2013.01); *H01J 37/32541* (2013.01)
(58) Field of Classification Search
    USPC ........................... 156/345.33, 345.34, 345.37, 156/345.43–345.47; 118/715, 722, 723 R, 118/723 E; 315/111.21
    See application file for complete search history.

(56) References Cited

U.S. PATENT DOCUMENTS

| 5,445,709 | A  | 8/1995 | Kojima et al. |
| 5,647,945 | A  | 7/1997 | Matsuse et al. |
| 2001/0006093 | A1 | 7/2001 | Tabuchi et al. |
| 2004/0129224 | A1 | 7/2004 | Yamazaki |

FOREIGN PATENT DOCUMENTS

| JP | 63234532  | 9/1988 |
| JP | 831594    | 2/1996 |
| JP | 9213684   | 8/1997 |
| JP | 2002348670| 12/2002 |
| JP | 2004134671| 4/2004 |
| JP | 2006331740| 12/2006 |

OTHER PUBLICATIONS

English Machine Translation of JP 09-213684. Obtained from http://www19.ipdl.inpit.go.jp/PA1/cgi/bin/PA1DETAIL on Apr. 19, 2012.
English Machine Translation of JP 2004-134671. Downloaded on Sep. 17, 2013 from http://11119.ipdl.inpit.go.jp/PA1/cgi-bin/PA1DETAIL.

*Primary Examiner* — Maureen Passey
(74) *Attorney, Agent, or Firm* — Rothwell, Figg, Ernst & Manbeck, P.C.

(57) ABSTRACT

A plasma processing apparatus includes a first electrode and a second electrode so arranged in the upper portion of a processing chamber as to face a mounting table, a gas supply unit for supplying a processing gas between the first electrode and the second electrode, a RF power supply unit for applying a RF power between the first electrode and the second electrode for converting the process gas supplied between the electrodes into a plasma, and a gas exhaust unit for evacuating the inside of the processing chamber to a vacuum level from the lower portion of the processing chamber. Since the electron temperature in the plasma is low near a substrate on the mounting table, damage to the substrate caused by the plasma can be suppressed. In addition, since a metal can be used as a material for the processing chamber, the processing chamber can have good temperature controllability.

4 Claims, 20 Drawing Sheets

PLASMA PROCESSING APPARATUS, PLASMA PROCESSING METHOD AND STORAGE MEDIUM

CROSS-REFERENCE TO RELATED APPLICATIONS

The present application is a Divisional Application of and claims the benefit of priority from co-pending U.S. application Ser. No. 12/523,212, filed Aug. 20, 2009, which is a national stage application of PCT/JP2007/075076, filed Dec. 27, 2007, which claims the benefit of priority to Japanese Patent Application No. 2007-006206, filed Jan. 15, 2007, the entire contents of which are incorporated herein by reference.

FIELD OF THE INVENTION

The present invention relates to a plasma processing apparatus, a plasma processing method and a storage medium storing a program for executing the plasma processing method.

BACKGROUND OF THE INVENTION

For example, in a manufacturing process of a semiconductor device or a liquid crystal device, a substrate is subjected to a process such as etching, sputtering, CMP (Chemical Vapor Deposition) or the like. In those processes, a plasma processing apparatus using plasma is widely used. In the plasma processing apparatus, a processing gas is injected into a processing chamber accommodating the substrate and, then, the processing gas is converted to plasma and activated, so that each of the above-mentioned processes is performed on the substrate.

Hereinafter, various plasma processing apparatuses are explained specifically. FIG. 17 shows a parallel-plate dual-RF (Radio Frequency) type plasma etching apparatus 101 which generates capacitively-coupled plasma (CCP) by using a RF electric field formed between both electrodes. The plasma etching apparatus 101 includes a processing chamber 102 as a vacuum chamber, a mounting table 103 for mounting thereon a wafer W and serving as a lower electrode within the processing chamber 102, and a gas shower head 105 having a plurality of gas supply holes 104 and forming a ceiling plate of the processing chamber 102.

Sidewalls of the processing chamber 102 are made of, e.g., aluminum, and inner surfaces of sidewalls are covered and insulated with a ceramic such as yttrium oxide ($Y_2O_3$) or alumite ($Al_2O_3$) or the like. Moreover, within the sidewalls there are coolant flow channels 106 circling along the sidewalls to control a temperature thereof.

The gas shower head 105 is provided at its lower side with an upper electrode 107 which includes a metal base 108 made of, e.g., aluminum, and a conductive plate 109 made of, e.g., silicon, which is located on a lower surface of the metal base 108. Although not shown in FIG. 17, within the metal base 109, there are coolant flow channels to control a temperature of the gas shower head 105.

A reference numeral 110 in FIG. 17 refers to a gas supply source which supplies the gas shower head 105 with processing gas which, in turn, is supplied to the wafer W through the gas supply holes 104. A reference numeral 111 in FIG. 17 refers to a gas exhaust line which exhausts the gas in the processing chamber 102, thereby bringing the pressure of the chamber 102 into a predetermined value. Reference numerals 112, 113 in FIG. 17 refer to first and second RF power supplies respectively. If each of the first and second RF power supplies 112, 113 turns on after the processing gas has been supplied to the processing chamber, a RF power of, e.g., 13 MHz to 60 MHz from the first RF power supply 112 is applied to the upper electrode 107 to generate plasma under the upper electrode 107 as shown in a dotted line of FIG. 17 and activate the processing gas, and at the same time, a RF power of, e.g., 0.38 MHz to 13 MHz from the second RF power supply 113 is applied to the mounting table 103 to generate a biasing potential which attracts ions in the plasma toward the wafer W to etch the surface of the wafer W.

In the plasma etching apparatus 101, the gas shower head 105 and the processing chamber 102 are made of metal materials and have the coolant flow channels to cool down them, so that the temperatures of the gas shower head 105 and the processing chamber 102 can be controlled. Accordingly, even when a plurality of wafers W of a same lot is processed sequentially, temperature increasing due to accumulated heat in each sequential process can be avoided. As a result, processing variations on the wafer W due to the heat from the gas shower head 105 and the processing chamber 102 can be avoided. Further, even when, e.g., a processing gas whose components are readily deposited in a high temperature level is used, deposition of the components can be suppressed by controlling the temperatures of the gas shower head 105 and the processing chamber 102. Consequently, it is possible to suppress the likelihood that deposits become particles to contaminate the wafer W.

Following is a description of a plasma etching apparatus 120 as shown in FIG. 18. The plasma etching apparatus 120 generates plasma by using microwaves. In FIG. 18, for elements or units having the same configuration as those of the plasma etching apparatus 101 shown in FIG. 17, the same reference numerals are used. A reference numeral 121 in FIG. 18 refers to a first gas supply unit which forms a ceiling plate of a processing chamber 102 and is made of a ceramic of, e.g., silicon oxide ($SiO_2$) or $Al_2O_3$ or the like so as to transfer microwaves to a lower surface thereof as will be explained later. The first gas supply unit 121 also forms a gas shower head. Provided in lower parts of the first gas supply unit 121 are first gas supply holes denoted as a reference numeral 122. A reference numeral 123 refers to a gas supply source for supplying a plasma generating gas. The gas supply source 123 supplies the plasma generating gas 122 into the processing chamber through a gas path 124 provided within the first gas supply unit 121 and, then, the first gas supply holes 122.

A reference numeral 125 in FIG. 18 refers to a second gas supply unit which partitions the space between the first gas supply unit 121 and a mounting table 103, and also forms a gas shower head. The second gas supply unit 125 includes a plurality of second gas supply holes 126. A reference numeral 127 refers to a gas supply source for supplying a processing gas such as an etching gas or a depositing gas. The processing gas supply source 127 supplies the processing gas toward the wafer W through a gas path 128 provided within the second gas supply unit 125 and, then, the second gas supply holes 126. A reference numeral 129 refers to through-holes penetrating through the second gas supply unit 125 so as to supply the etching gas from the first gas supply unit 121 toward the wafer W.

A reference numeral 131 in FIG. 18 refers to a microwave generating unit which supplies microwave having a frequency of, e.g., 2.45 GHz or 8.3 GHz. The microwaves move through a transfer unit 132 and the first gas supply unit 121, and, then, are emitted toward a processing space under the first gas supply unit 121, so that the plasma generating gas from the first gas supply unit 121 is converted to plasma as shown by a dotted line of FIG. 18. Thereafter, the plasma-converted plasma generating gas goes down and, then, converts the processing gas supplied from the second gas supply unit 125 to plasma, so that the plasma-converted processing gas processes the surface of the wafer W.

Following is a description of a plasma etching apparatus 141 as shown in FIG. 19A. The plasma etching apparatus 141 generates inductively-coupled plasma (ICP) and includes a processing chamber 142 made of quartz. Reference numerals 143, 144 in FIG. 19A refer to nozzles for supplying a processing gas. As shown in FIG. 19B, a coil 145 winds around upper portions of the processing chamber 142. One end of the coil 145 is connected to a RF power supply 112 and the other end thereof is connected to ground. If an electric current is applied to the coil 145 after the processing gas has been supplied from the nozzles 143, 144, an electric field is generated in the processing chamber 142 to generate plasma as shown by a dotted line in FIG. 19A.

However, because in the parallel-plate electrode type (capacitively-coupled type) plasma etching apparatus 101 of FIG. 17, the RF power is applied directly between the upper electrode 107 and the mounting table 103 serving as the lower electrode, the electron temperatures in the plasma in the apparatus 101 of FIG. 17 becomes increased to, e.g., 3 eV to 4 eV compared with the microwave plasma etching apparatus 120 or the inductively-couple plasma etching apparatus 141. Accordingly, in the etching apparatus 101, ions or the like having a high level energy collides with the wafer W, which may cause significant damage to the wafer W.

Additionally, in the etching apparatus 101, there appear interferences of the two RF powers, since the plasma generating RF power is applied to the upper electrode 107 serving as a ceiling plate of the processing chamber, and, at the same time, the biasing RF power is applied to the mounting table 103 serving as the lower electrode. As a result, a waveform of the RF power applied to the mounting table 103 is distorted, and, hence, it is difficult to control the RF power. Moreover, this is reason why variations of energy distribution of ions in the plasma on the surface of the wafer W occur. On the other hand, such variations can be controlled to be negligible by adjusting parameters such as frequency, power level and the like of each of the RF power supplies 112, 113. However, because this approach will need to control as many parameters as possible, not only it will take long time but also many parameters must be fixed for suppressing the variations, thereby decreasing the degree of freedom in the plasma processing. Moreover, a shape of ion collision distribution where a horizontal axis represents an ion energy level and a vertical axis represents a collision frequency of ions against the substrate corresponds to a shape of the waveform of the biasing RF power if the biasing RF power does not interfere with the plasma generating RF power when the biasing RF power is applied to the mounting table 103. Thus, an adequate shape of the ion collision distribution shall be selected based on the processing process. However, when the biasing and plasma generating RF powers interfere with each other, such a selection will be not performed with a good precision.

To solve the above problem, a gap between the upper electrode 107 and the mounting table 103 can be as large as possible. However, in this approach, the plasma itself may not be generated, making it impossible to perform the normal processing.

On the other hand, in the microwave plasma etching apparatus 120 of FIG. 18, the microwaves emitted from the ceiling plate do not interfere with the biasing RF power applied to the mounting table 103 and, hence, the waveform of the biasing RF power applied to the mounting table 103 is not distorted. Further, the electron temperature beneath the first gas supply unit 121 becomes as high as 5 eV to 10 eV, whereas the electron temperature near the wafer W becomes as low as 1 eV to 2 eV. This is because the processing gas near the wafer W is converted to the plasma by actions of the plasma generating gas supplied from the first gas supply unit 121. Accordingly, the energy of ions or electrons acting toward the wafer W is low, so that the wafer damage by the plasma can be suppressed.

However, in the microwave plasma etching apparatus 120 of FIG. 18, the first gas supply unit 121 forming the ceiling plate of the apparatus 120 is made of the ceramic so as to effectively transfer the microwaves to the lower surface thereof, but it is difficult to control the temperature of the first gas supply unit 121. This is because a heat capacity of the ceramic is larger than that of a metal such as aluminum or the like. Therefore, when a plurality of the wafers W within the same lot is processed sequentially, the heat from each sequential process is accumulated onto the first gas supply unit 121. As a consequence, the accumulated heat makes an influence on the processing of the wafer W, which may cause processing variations between wafers. In addition, as mentioned above, when, e.g., the processing gas whose components are readily deposited in a high temperature level is used, the deposits of the gas become particles to contaminate the wafer W.

Further, in the microwave plasma etching apparatus 120 of FIG. 18, an inner space of the processing chamber 102 becomes vacuum state during the processing and, hence, a diffusibility of the processing gas increases. For this reason, it is likely that some of the processing gas supplied from the second gas supply unit 125 does not diffuse toward the wafer W but diffuses into a space near the first gas supply unit 121 through the through-holes 129, and, then, turns back toward the wafer W. Further, as mentioned above, the electron temperature near the first gas supply unit 121 is higher than the electron temperature near the wafer W. Accordingly, a dissociation level at which molecules of the processing gas are dissociated into ions or radicals, an energy level and, hence, a reaction level with the wafer W are different between the processing gas supplied directly from the second gas supply unit 125 onto the wafer W and the processing gas that is supplied from the second gas supply unit 125 and diffuses into the space near the first gas supply unit 121, and, then turns back toward the wafer W. In conclusion, wafer in-plane variations and/or wafer to wafer variations of the processing may occur.

Further, in the inductively-couple plasma etching apparatus 141 of FIG. 19A, a RF current is not applied directly into the processing chamber 142 and, hence, the waveform of the RF power supplied to the mounting table 103 is not distorted. However, because a heat capacity of the quartz is larger than that of a metal such as aluminum or the like, it is difficult to control the temperature of the processing chamber 142 made of the quartz. Accordingly, the heat from each wafer processing is accumulated into the sidewalls and the ceiling plate of the processing chamber 142. As a consequence, there may occur the wafer to wafer processing variations in the same lot as in the microwave plasma etching apparatus 120. In addition, as in the microwave plasma etching apparatus 120, when, e.g., the processing gas whose components are readily deposited in a high temperature level is used, the deposits of the gas become particles to contaminate the wafer W.

Further, in the inductively-couple plasma etching apparatus 141, an electric field is generated in an upper part of the processing chamber 142 and, hence, it is impossible to supply the processing gas by using the gas shower head. For this reason, the processing gas is supplied from nozzles in the etching apparatus 141. Thus, it is difficult to uniformly supply the gas on the wafer W, so that wafer in-plane uniformity in the etching process decreases.

In conclusion, each of the above-mentioned plasma processing apparatuses has at least one among defections including the difficulty to control the temperature of the sidewalls and the ceiling plate of the processing chamber, the substrate damage by the plasma, the non-uniformity of the gas supply to the substrate, and the difficulty to control the waveform of the RF power.

SUMMARY OF THE INVENTION

In view of the above, the present invention provides a plasma processing apparatus and method for easily controlling the temperature of the sidewalls of the processing chamber and capable of suppressing the substrate damage by the plasma.

In accordance with a first aspect of the present invention, there is provided a plasma processing apparatus having a processing chamber and a mounting table provided within the processing chamber for processing a substrate mounted on the mounting table by plasma which processing gas is converted to, the apparatus including: first and second electrodes provided in an upper portion of the processing chamber so as to face the mounting table; a gas supply unit for supplying the processing gas into between the first and second electrodes; a radio frequency (RF) power supply unit connected to at least one of the first and second electrodes for applying a RF power between the first and second electrodes so that the processing gas supplied into between the first and second electrodes is converted to the plasma; and a gas exhaust unit coupled to a lower portion of the processing chamber for exhausting the inside of the processing chamber to a vacuum level.

The gas supply unit is located above the first and second electrodes, and faces the mounting table, and has a plate-type body in which a plurality of gas supply holes are formed. The gas supply unit is provided with a temperature adjustment mechanism for adjusting a temperature of the gas supply unit. The processing chamber is made of a metal and is provided with a temperature adjustment mechanism for adjusting a temperature of the processing chamber. Each of the first and second electrodes has a plurality of teeth which horizontally extend (extend abreast) in parallel with each other, and the teeth of the first electrode and the teeth of the second electrode are alternately arranged. Each of the first and second electrodes has a base, the base of the first electrode and the base of the second electrode facing each other in a horizontal direction, and the teeth of the first electrode and the teeth of the second electrode respectively extend from the base of the first and second electrode so as to face each other.

The first and second electrodes are formed as concentric ring-shape members, having different diameters. At least one of the ring-shape member forming the first electrode and the ring-shape member forming the second electrode is provided in plural, the ring-shape member forming the first electrode and the ring-shape member forming the second electrode are alternately disposed, and distance between the neighboring ring-shape members gets smaller as it goes away from the center of the ring-shape members.

The gas supply unit is formed as the entirety or a portion of one of the first and second electrodes. A plurality of linear protrusions, which horizontally extend (extend abreast) in parallel with each other spaced apart from each other, are arranged at a lower surface of the gas supply unit, the linear protrusions are formed as a part of one of the first and second electrodes, and the other of the first and second electrodes is disposed under the linear protrusions or at a side thereof. The pluralities of the linear protrusions are formed in a shape of a ring or straight-line. The first and/or second electrodes are provided with a plurality of holes for making an electric potential of the entire surface thereof uniform, to the holes penetrating through the corresponding first and/or second electrodes.

The RF power supply is a first RF power supply, a lower electrode is provided in the mounting table, and a second RF power supply for biasing and attracting the plasma due to the processing gas toward the substrate is connected to the lower electrode. The first and second electrodes have flow channels for a temperature adjustment fluid for adjusting temperatures of the first and second electrodes, respectively.

In accordance with a second aspect of the present invention, there is provided a plasma processing method for processing a substrate by plasma due to a processing gas, the method includes: mounting the substrate onto a mounting table provided within a processing chamber; supplying the processing gas into between first and second electrodes provided in an upper portion of the processing chamber so as to face the mounting table; applying a RF power between the first and second electrodes so that the processing gas supplied into between the first and second electrodes is converted to the plasma; and exhausting the inside of the processing chamber from a lower portion of the processing chamber to a vacuum level. The processing gas is supplied into between the first and second electrodes through a plurality of gas supply holes formed through a plate-type body that is located above the first and second electrodes to face the mounting table.

A storage medium storing a computer-readable program for performing a plasma processing method for processing a substrate by plasma due to a processing gas, the method includes: mounting the substrate onto a mounting table provided within a processing chamber; supplying the processing gas into between first and second electrodes provided in an upper portion of the processing chamber so as to face the mounting table; applying a RF power between the first and second electrodes so that the processing gas supplied into between the first and second electrodes is converted to the plasma; and exhausting the inside of the processing chamber from a lower portion of the processing chamber to a vacuum level.

In accordance with the present invention, the first and second electrodes are provided in an upper portion of a processing chamber and a RF power is applied between them, so that an electron temperature in plasma near a substrate on the mounting table becomes lower to effectively suppress the substrate damage by the plasma. Further, a metal is used as a material of the processing chamber to easily control a temperature of the processing chamber as in the parallel-plate electrode type plasma processing apparatus.

DETAILED DESCRIPTION OF THE EMBODIMENT

First Embodiment

Figure 1:
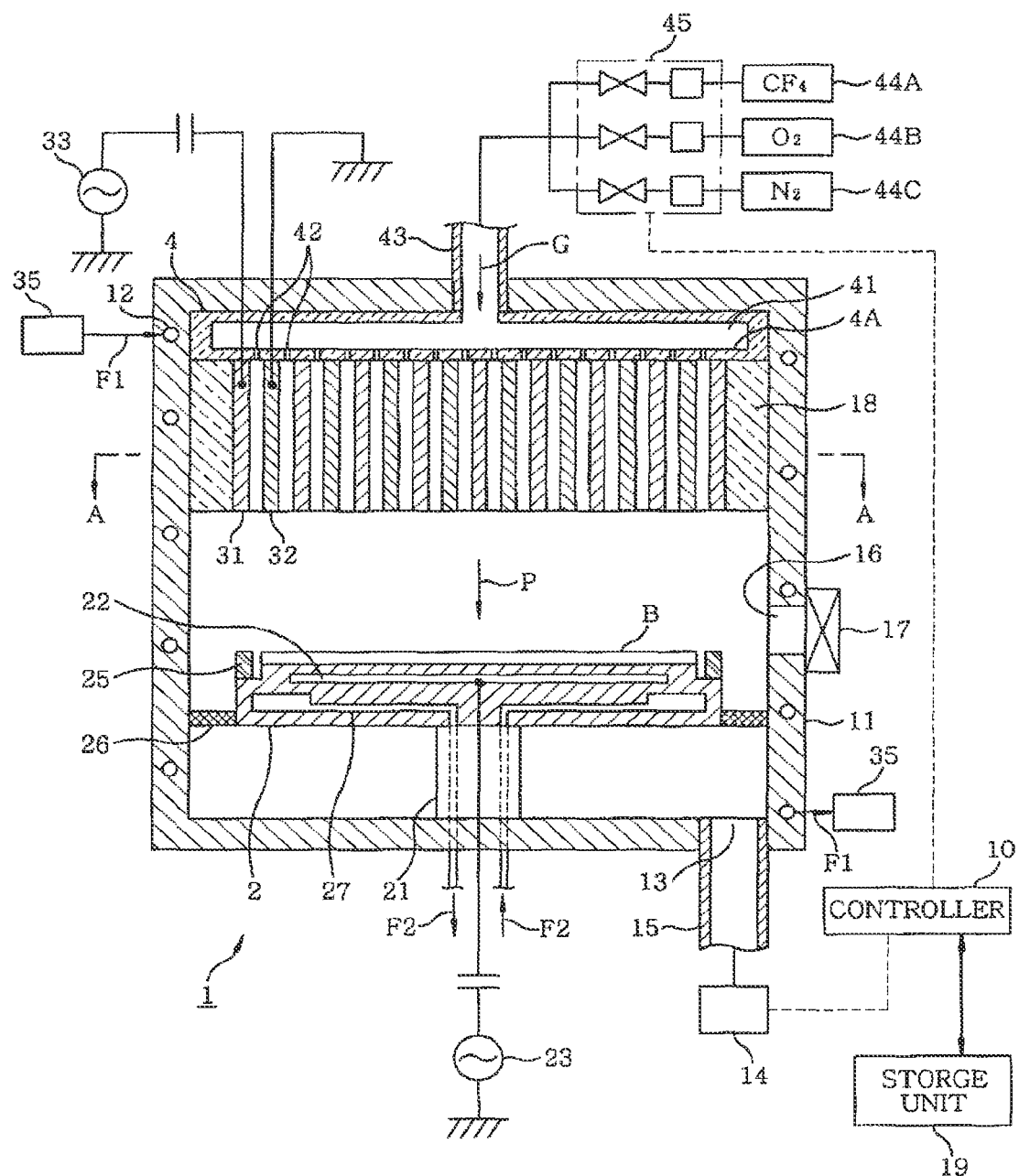
FIG. 1 is a vertical cross-sectional side view showing a plasma etching apparatus in accordance with a first embodiment of the present invention.

Referring to FIG. 1, a configuration of a plasma etching apparatus 1 in accordance with a first embodiment of the present invention will be described. The plasma etching apparatus 1 processes, e.g., a rectangular type substrate B such as an FPD (Flat Panel Display) or the like. The plasma etching apparatus 1 includes a tubular processing chamber 11 having enclosed sealed inner processing space, a mounting table 2 installed at a center region in a lower inner space of the processing chamber 11, electrodes 31, 32 provided above the mounting table 2 to generate plasma P, and a gas shower head (gas supply unit) 4 disposed above the electrodes 31, 32 to face the mounting table 2.

The processing chamber 11 is made of a metal, e.g., aluminum having a superior cooling ability than ceramic or the like, and inner surfaces of the processing chamber 11 are coated and insulated with, e.g., alumite. Further, the processing chamber 11 has flow channels 12 for a temperature adjustment fluid $F_1$ at sidewalls thereof. The flow channels 12 spirally extend along and within the periphery sidewalls of the processing chamber 11 from its upper portion to its lower portion as shown in an arrow of FIG. 1. Further, the apparatus 1 includes a temperature adjustment mechanism 35 for adjusting a temperature of the processing chamber 11. Here, the temperature adjustment fluid $F_1$ circulates between the temperature adjustment mechanism 35 and the processing chamber 11. In this way, a coolant, e.g., cooling water as the temperature adjustment fluid $F_1$ flows through the flow channels 12 during the etching process, thereby controlling, e.g., decreasing the temperature of the inner surface of sidewalls of the processing chamber 11.

Moreover, a gas exhaust unit 14 including a vacuum pump and a pressure adjustment part is coupled through a gas exhaust line 15 to a gas exhaust port 13 provided in a bottom portion of the processing chamber 11. The pressure adjustment part maintains the inside of the processing chamber 11 to a desired vacuum level according to a control signal from a controller 10 to be described later. A reference numeral 16 refers to a transfer opening provided in one sidewall of the processing chamber 11 to convey a substrate B and the conveyance opening 16 is opened or closed by a gate valve 17. A reference numeral 18 refers to a holder made of an insulating material which surrounds and holds the electrodes 31, 32 in a position above the mounting table 2.

The mounting table 2 has a rectangular shape corresponding to a shape of the substrate B and is supported by a support 21 located in a lower portion of the processing chamber 11. Further, a lower electrode 22 is embedded into the mounting table 2. The lower electrode 22 applies a biasing potential to the substrate B and attracts ions generated from a processing gas G to be described later toward the substrate B, thereby improving a vertical level of an etching shape. Moreover, the lower electrode 22 is connected to a RF power supply 32 of, e.g., 0.38 MHz to 13 MHz which corresponds to a second RF power supply in the claims.

In addition, on outer periphery edges of the mounting table 2, a focus ring 25 is installed so as to surround the substrate B. During generating plasma P, the corresponding plasma P is concentrated to the substrate B through the corresponding focus ring 25. A baffle plate 26 having a shape of a square frame is installed at an outer periphery of the mounting table 2 and partitions the inner space of the processing chamber 11. The baffle plate 26 has a plurality of holes opened in a direction of thickness thereof to make a flow of the gas near the substrate B uniform while exhausting the inside of the processing chamber 11.

The mounting table 2 has therein flow channels 27 of a coolant, e.g., cooling water as temperature adjustment fluid $F_2$. The cooling water flows through the flow channels 27 to cool down the mounting table 2 and control the temperature of the substrate B mounted on the mounting table 2 to a desired level. Further, the mounting table 2 is provided with a temperature sensor (not shown) which senses the temperature of the substrate B on the mounting table 2.

Figure 2:
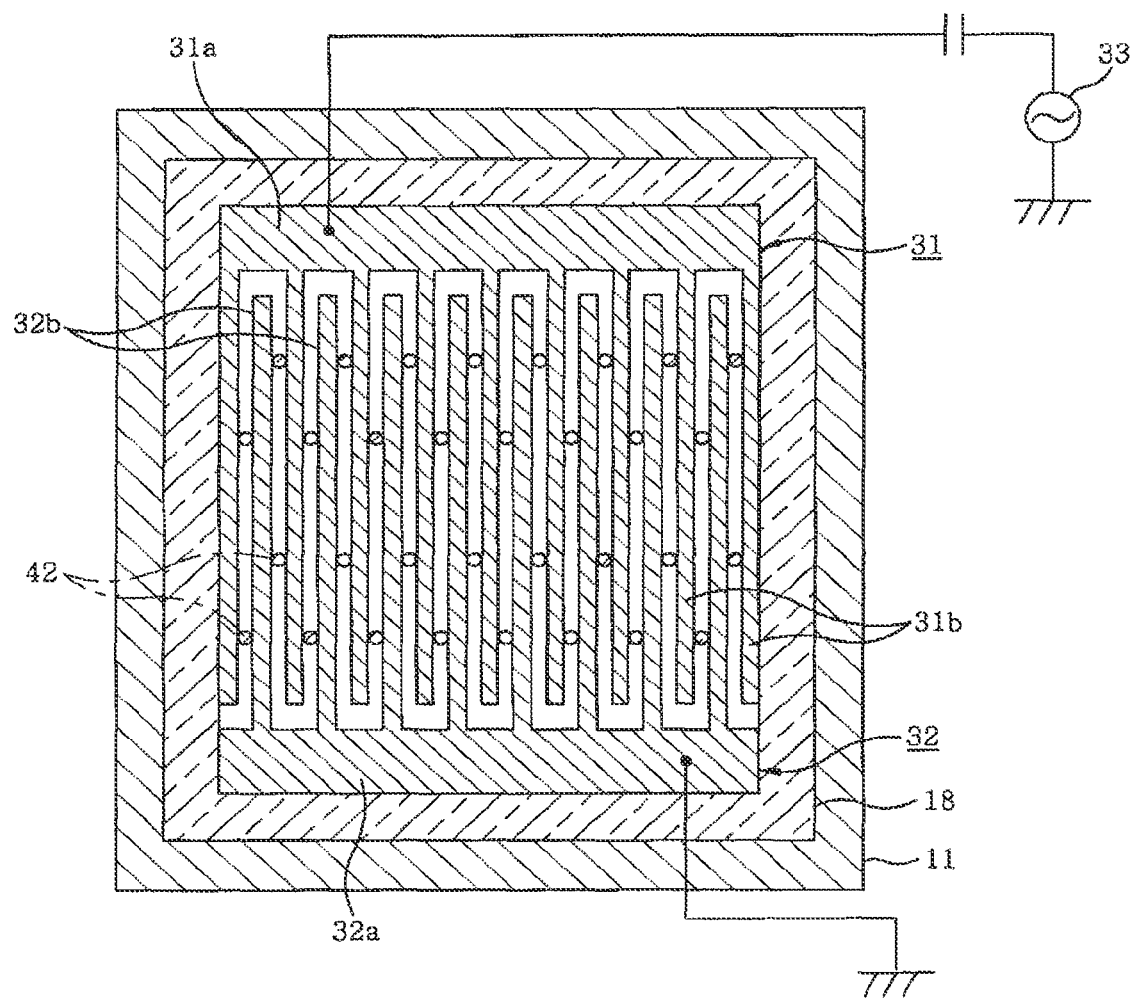
FIG. 2 is a transverse cross-sectional plan view showing a comb electrode included in the plasma etching apparatus.

Following is a description of the electrodes 31, 32 disposed above the mounting table 2. FIG. 2 shows a transversal cross-sectional plan view of the electrodes 31, 32 taken along a line A-A of FIG. 1. The electrodes 31, 32 have a comb shape. That is the electrodes 31, 32 respectively have bases 31a, 32a and a plurality of teeth 31b, 32b which horizontally extend in parallel pattern from the bases 31a, 32a. The base 31a of one electrode 31 and the base 32a of the other electrode 32 are adhered to the opposite side surfaces of the holder 18 and arranged to face each other in a horizontal direction. The teeth 31b of the one electrode 31 and the teeth 32b of the other electrode 32 are alternately disposed so that one tooth 32b can extend along and between two neighboring teeth 31b. The electrodes 31, 32 are made of, e.g., aluminum (Al) and their surfaces are coated with an insulating material, e.g., $Y_2O_3$. In this example, the electrodes 31, 32 respectively correspond to first and second electrodes in the claims and, hereinafter, will be named "comb electrodes 31, 32".

Figure 3:
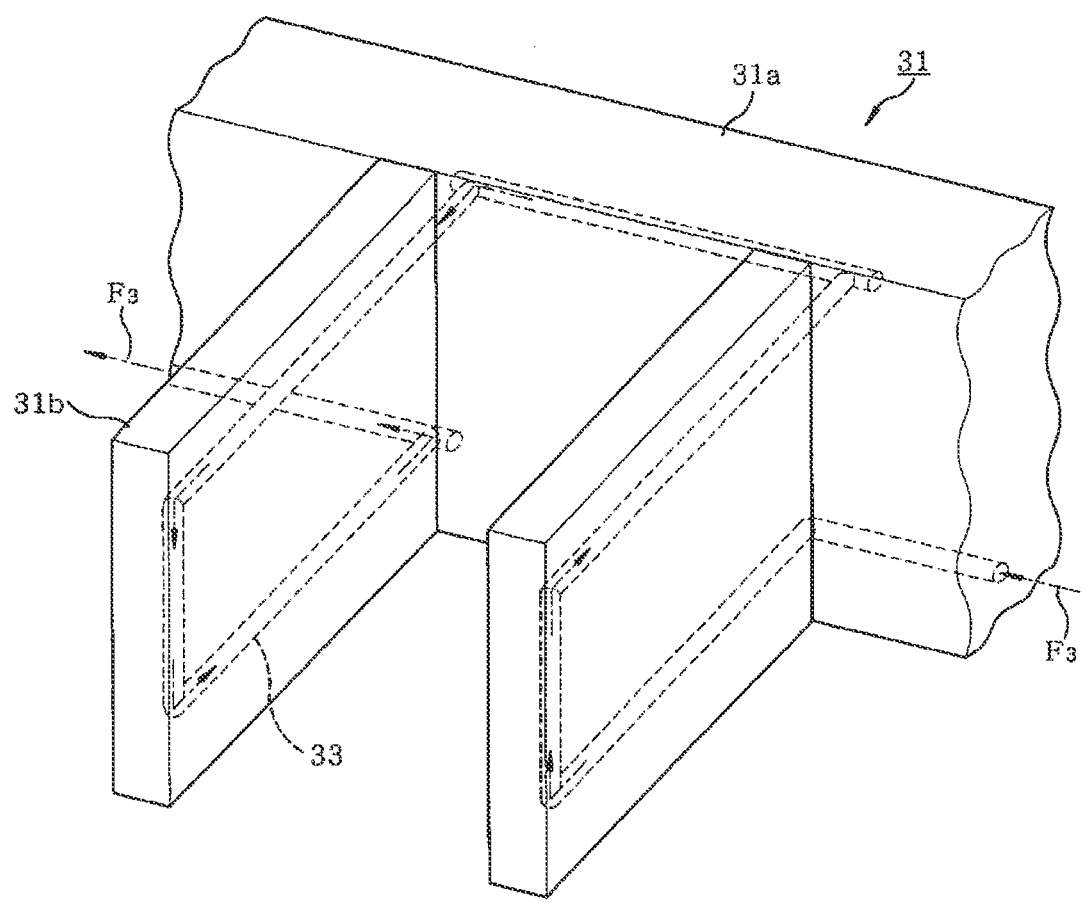
FIG. 3 is a perspective view showing coolant flow channels provided in the comb electrodes.

As shown in FIG. 3, flow channel 33 of a coolant, e.g., cooling water as temperature adjustment fluid $F_3$ is formed in the comb electrode 31. The flow channel 33 runs from one end of the base 31a and is bent toward a tip end of the adjacent tooth 31b. Then, the flow channel 33 is bent in substantially "u" shape at the tip end of the tooth 31b to turn back toward the base 31a. In this way, the flow channel 33 is extended through all the teeth 31b to the other end of the base 31a. In addition, although not shown in the drawings, the comb electrode 32 has the same flow channel as the flow channel 33 formed in the comb electrode 31. Meanwhile, during an etching process, the cooling water as the temperature adjustment fluid $F_3$ flows through the flow channel 33 as shown by arrows in FIG. 3 to cool down the comb electrodes 31, 32. For the sake of convenience, the flow channel 33 is not depicted in FIGS. 1 and 2.

The comb electrode 31 is connected to a plasma generating RF power supply 33 having a frequency of, e.g., 13 MHz to 60 MHz, higher than a frequency of a biasing RF power supply 23, while the comb electrode 32 is connected to ground. Although not shown in the drawings, the RF power supplies 23, 33 are connected to the controller 10, and the RF power supplied from each RF power supply to each corresponding electrode is controlled according to the control signal from the controller 10.

Following is a description of the gas shower head 4 as the gas supply unit. In this example, the gas shower head 4 is made of ceramic, e.g., quartz and forms the ceiling plate of the processing chamber 11. Moreover, the gas shower head 4 has therein a space 41 into which each processing gas to be described later is supplied. Further, the gas shower head 4 includes a plurality of gas supply holes 42 formed in its lower surface, the gas supply holes communicating with the space 41 and dispersedly and supplying the processing gas G into the processing space of the processing chamber 11. That is to say, the gas shower head 4 includes a plate shaped body 4A is located above the comb electrodes 31, 32 and opposite to the mounting table 2, which has the plurality of gas supply holes 42. As shown in FIGS. 1 and 2, each of the gas supply holes 42 is arranged to supply the processing gas G into gaps between the teeth 31b of the comb electrode 31 and the teeth 32b of the comb electrode 32.

A gas inlet line 43 is provided at a center region of an upper surface of the gas shower head 4 and penetrates through a center portion of the ceiling plate of the processing chamber 11. At upstream side of the gas inlet line 43, there are a plurality of branch lines whose one ends are connected to the gas inlet line 43, other ends of the branch lines are connected to gas supply sources 44A, 44B, 44C storing $CF_4$ gas, $O_2$ gas and $N_2$ gas as the etching gas, respectively. Each of the branch lines is provided with a valve and a flow rate controller which form a gas supply system 45. The gas supply system 45 controls the gas supply from each of the gas supply sources 44A, 44B, 44C, and a gas flow rate based on the control signal from the controller 10.

The plasma etching apparatus 1 is provided with the controller 10 comprising, e.g., a computer. The controller 10 includes a program, a memory, a data processing unit such as CPU and the like, where the program is programmed so that the controller 10 sends various control signals to each unit of the plasma etching apparatus 1 and, hence, performs each step of a plasma etching method to be described later to form a desired etching pattern on the substrate B. Further, the memory includes regions for storing processing parameters such as a processing pressure, a processing time, a gas flow rate, a power value, etc. Therefore, when the CPU executes each command of the program, the processing parameters are read out and the control signal corresponding to the each processing parameter is transmitted to each unit of the plasma etching apparatus 1.

The program (including a program related to a screen for inputting the processing parameters) is stored into a storage unit 19 such as a flexible disk, a compact disk, MO (Magneto-Optical) disk or the like and, then, is installed into the controller 10.

Following is a description of operation of the plasma etching apparatus 1. First of all, the cooling water flows through the flow channel 12 of the processing chamber 11 and each flow channel 33 of the comb electrodes 31, 32 to cool down the inner walls of the processing chamber 11 and the surfaces of the comb electrodes 31, 32. In addition, the cooling water flows through the flow channel 27 of the mounting table 2 to cool down the mounting table 2. Then, the gate valve 17 is opened and the substrate B is transferred into the processing chamber 11 by a transfer mechanism (not shown). After the substrate B is mounted onto the mounting table 2 horizontally, the transfer mechanism is removed from the processing chamber 11 and the gate valve 17 is closed.

When the coolant as the temperature adjustment fluid $F_2$ flows through the flow channels 27, the substrate B mounted on the mounting table 2 is cooled down to a predetermined temperature level. During this, the gas exhaust unit 14 exhausts a gas within the processing chamber 11 through the gas exhaust line 15 so that the inside of the processing chamber 11 is depressurized to a desired pressure level. At the same time, a processing gas G which is a mixture of the $CF_4$ gas, the $O_2$ gas and the $N_2$ gas is supplied into the processing chamber 11 via spaces between the comb electrodes 31, 32. Then, the RF power supplies 23, 33 are turned on, e.g., simultaneously. Thus, the RF power is applied to the lower electrode 22 and, at the same time, the RF power is applied between the neighboring comb electrodes 31, 32.

Figure 4:
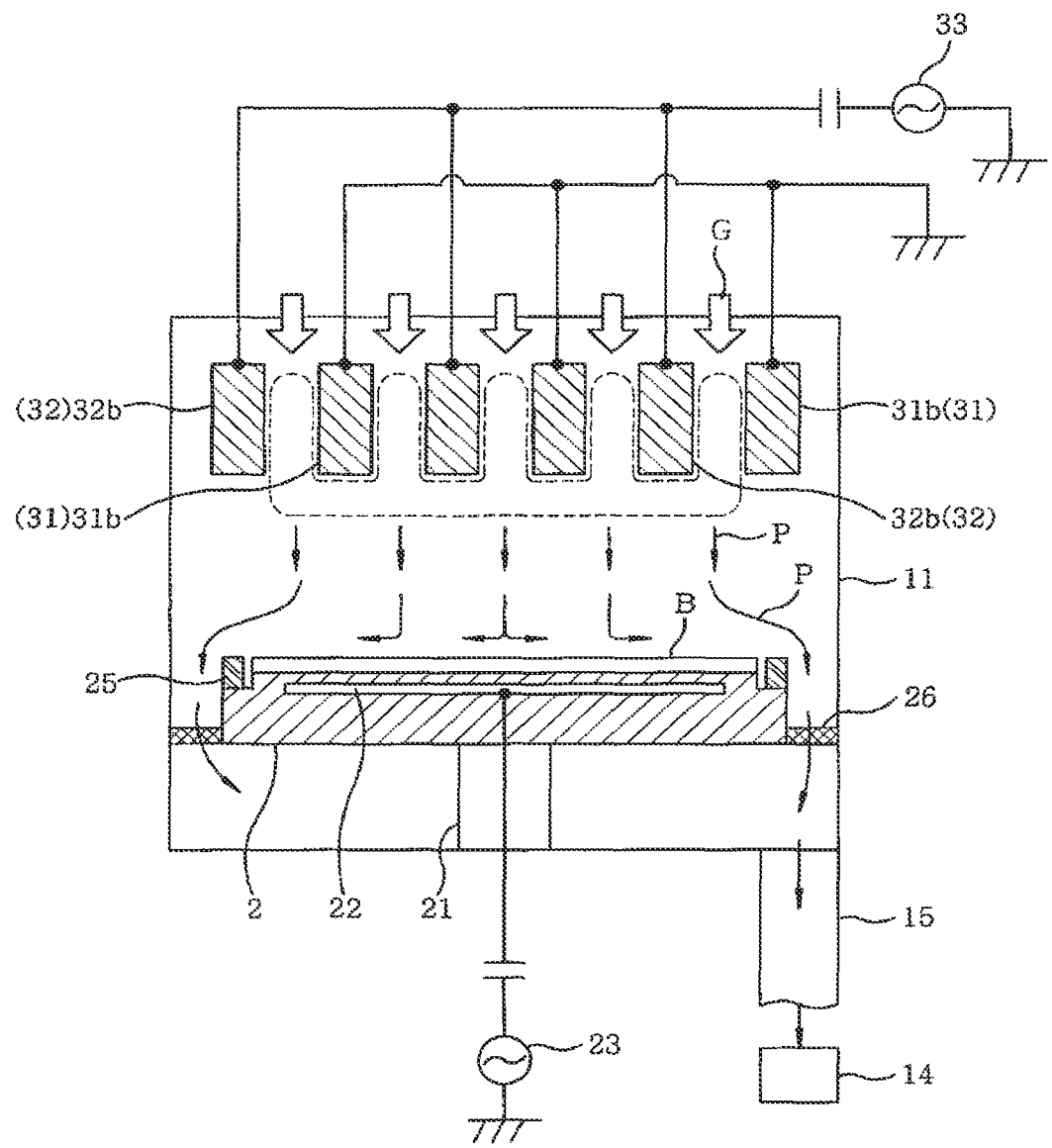
FIG. 4 describes the state in which the plasma etching apparatus performs an etching process.

FIG. 4 illustrates the state of the gas within the processing chamber 11 and the plasma P when the RF power is applied to the lower electrode 22 and, at the same time, the RF power is applied between the neighboring comb electrodes 31, 32. In FIG. 4, each of the teeth 31b, 32b of the comb electrodes 31, 32 is depicted schematically and large arrows represent the processing gas G supplied between the comb electrodes 31, 32. As above, the RF power is applied between the comb electrodes 31, 32 so that a RF electric current flows between the comb electrodes 31, 32. Thus, the high frequency energy activates the processing gas G and, hence, the plasma P is generated between the comb electrodes 31, 32, which located far from the substrate B on the mounting table 2, as shown in a dotted line. Here, the generated plasma P is the capacitively-coupled plasma referred to as a remote plasma having an electron temperature of 3 eV to 4 eV. Further, because the gas exhaust unit 14 exhausts the gas at the lower side of the inside of the processing chamber 11, the generated plasma P goes down and away from the area where the electric field are formed. So the electron temperature of the plasma P changes to 1 eV to 2 eV near the substrate B. In addition, a variety of ions contained the plasma P are attracted toward the substrate B by applying the RF power to the lower electrode 22, thereby performing an anisotropic etching on the substrate B.

After the RF power has been applied between the comb electrodes 31, 32 and a predetermined time lapses, for example, the RF power supplies 23, 33 are turned off to extinguish the plasma P and, at the same time, the supplying of the $CF_4$ gas, the $O_2$ gas and the $N_2$ gas into the processing chamber 11 is stopped. Thereafter, the gas exhaust unit 14 exhausts the processing gas remained in the processing chamber 11. Next, the gate valve 17 is opened, and the substrate B is removed from the processing chamber 11 by the transfer mechanism. Then, for example, subsequent substrate B of the same lot is transferred into the processing chamber 11 to be subject to the etching process.

In the plasma etching apparatus 1, the RF power is applied between the teeth 31b, 32b of the comb electrodes 31, disposed in a horizontal direction above the mounting table, so that the processing gas G supplied from the gas shower head 4 is converted to the plasma P. Then, the plasma P is attracted toward the mounting table 2 by the exhaustion performed at the lower side of the processing chamber 11. In this manner, the plasma P is generated in a location which is spaced apart from the mounting table and, hence, the electron temperature is lower near the substrate B than near the comb electrodes 31, 32. Accordingly, the substrate damage by the plasma P is suppressed. Further, because the comb electrodes 31, 32 for applying the plasma generating RF power and the lower electrode 22 for applying the biasing RF power are separated from each other, the RF power applied between the comb electrodes 31, 32 does not affect the biasing RF power applied to the mounting table 2 for attracting the plasma P, thereby suppressing the distortion of the waveform of the latter RF power. Thus, it is easy to control an energy distribution of ions near the substrate B and a ratio of ions/radicals implanted into the substrate B and, hence, substrate in-plane variations and substrate to substrate variations of the processing are suppressed.

Further, according to the present invention, the plasma generating electric field is confined within the upper portion of the processing chamber 11, so that the waveform of the biasing RF power applied in the lower portion of the processing chamber 11 is not deformed unlike the case of the parallel-plate electrode type plasma processing apparatus. For this reason, when waveform of the biasing RF power is adjusted, the ion collision distribution (where the horizontal axis represents an ion energy level and the vertical axis represents a collision frequency of ions into the substrate as described above) complies with the adjusted waveform of the biasing RF power. Here, the examples of the waveform include a sine wave, a triangle wave, a square wave and the like, and the parameters of the waveform include a voltage level, rising and falling of waveform, and the like. Further, an adequate ion collision distribution in each process is obtained by adjusting the parameters of the waveform.

Additionally, the processing chamber 11 is made of a metal and the cooling water as the temperature adjustment fluid $F_1$ flows through the channels formed in the sidewalls of the chamber 11, so that the control of the temperature of the processing chamber 11 is easier than the control of the temperature of a processing chamber made of ceramic or the like whose heat capacity is higher than the metal. Further, because the cooling water as the temperature adjustment fluid $F_3$ cools down the comb electrodes 31, 32, the stable plasma P is obtained. This help to perform a stable processing on the substrates B when the substrates B are continuously processed. Moreover, because the temperature of the inner walls of the processing chamber 11 and the comb electrodes 31, 32 can be controlled, the heat is not accumulated on the surfaces of them. For this reason, even when the processing gas G whose components are readily deposited in a high temperature level is used, it is possible to suppress occurrence of particles due to the deposits of the processing gas G.

Moreover, in this embodiment, the processing gas G is supplied downward by the gas shower head 4 from above toward the entire substrate B, which results in an improved in-plane uniformity compared with the case of supplying the processing gas by nozzles. In addition, the processing gas supplied from the gas shower head 4 is subject to the uniform actions of the electric field to be converted to the plasma P which, in turn, is supplied to the substrate B. Accordingly, the variations of the dissociation level at which molecule of the processing gas G are dissociated into ions or radicals are suppressed unlike the above-mentioned microwave plasma processing apparatus. As a result, the substrate in-plane variations of the processing and the variations of the processing between the substrates of the same lot can be suppressed.

Second Embodiment

Figure 5:
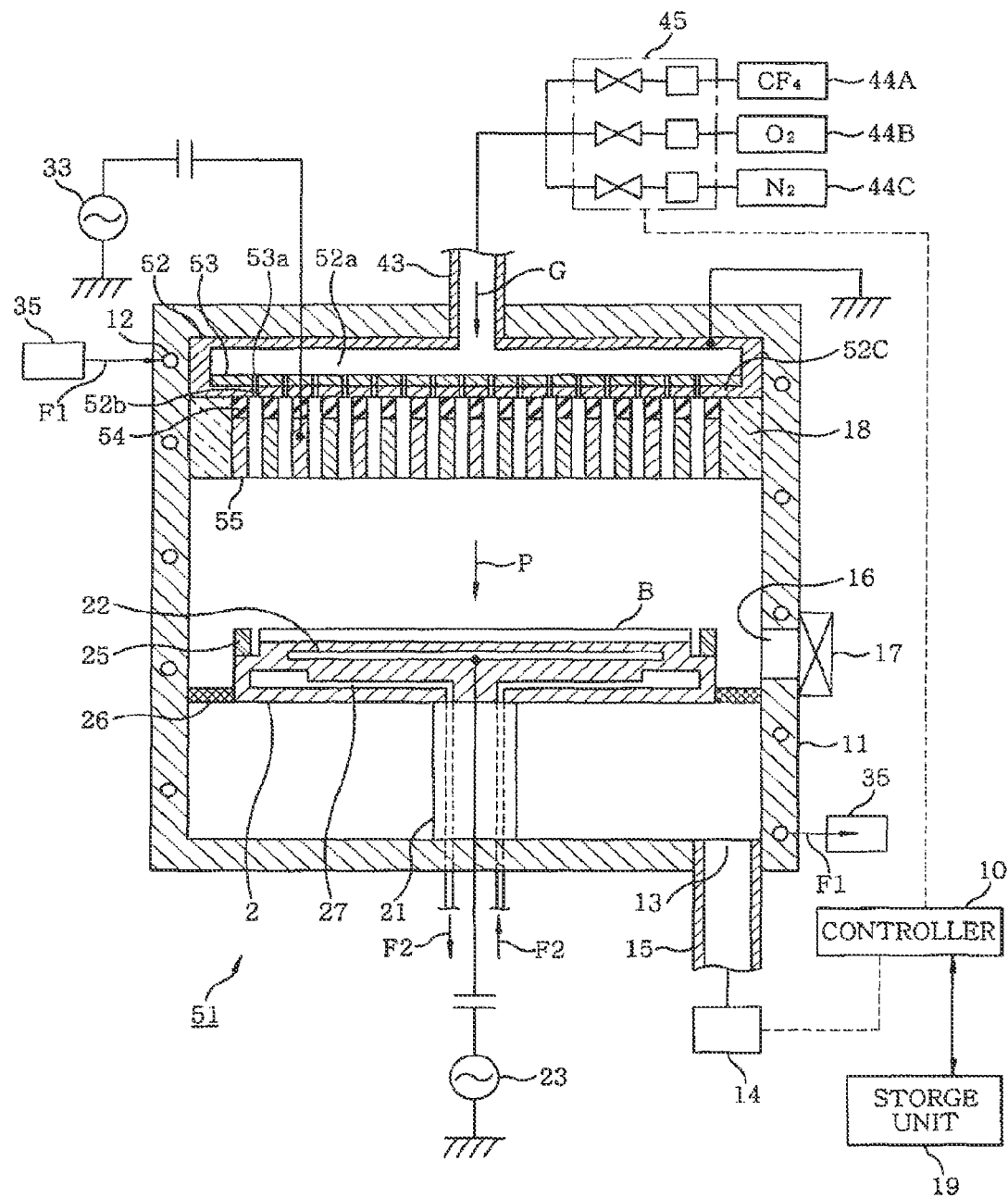
FIG. 5 is a vertical cross-sectional side view showing a plasma etching apparatus in accordance with another embodiment of the present invention.

Following is a description of a plasma etching apparatus 51 in accordance with another embodiment as shown in FIG. 5. The pair of the comb electrodes 31, 32 forming the first and second electrodes are provided under the gas shower head 4 in the above-mentioned embodiment, whereas one of the first and second electrodes is formed as a part of the gas shower head (gas supply unit) 52 and the other is formed as a comb electrode in this embodiment. Therefore, one comb electrode is provided under the gas shower head 52. In this etching apparatus 51, elements or units having the same configuration as them of the above-mentioned etching apparatus 1 use the same reference numerals as them of the etching apparatus 1.

The gas shower head 52 of the etching apparatus 51 is made of a metal such as aluminum or the like and the surface thereof is coated with an insulating material such as $Y_2O_3$ or the like. Moreover, the gas shower head 52 serves as the electrode connected to ground for generating plasma P together with a comb electrode 55 connected to a RF power supply 33 to be described later. In addition, a space 52a is provided within the gas shower head 52 as in the gas shower head 4 of the first embodiment, and the gas shower head 52 includes a plate-type body 52C having a plurality of gas supply holes 52b.

Within the space 52a of the gas shower head 52, a temperature adjustment plate (a temperature adjustment mechanism) 53 for adjusting the temperature of the gas shower head 52 is installed on the plate-type body 52C. In the temperature adjustment plate 53, a plurality of holes 53a is provided in a direction of thickness thereof so as to overlap the gas supply holes 52b of the gas shower head 52. In addition, within the temperature adjustment plate 53, flow channels (not shown) for the cooling water as the temperature adjustment fluid are provided in positions where the holes 53a are not formed. During the etching process, the cooling water flows through the flow channels to cool down the gas shower head 52.

Figure 6:
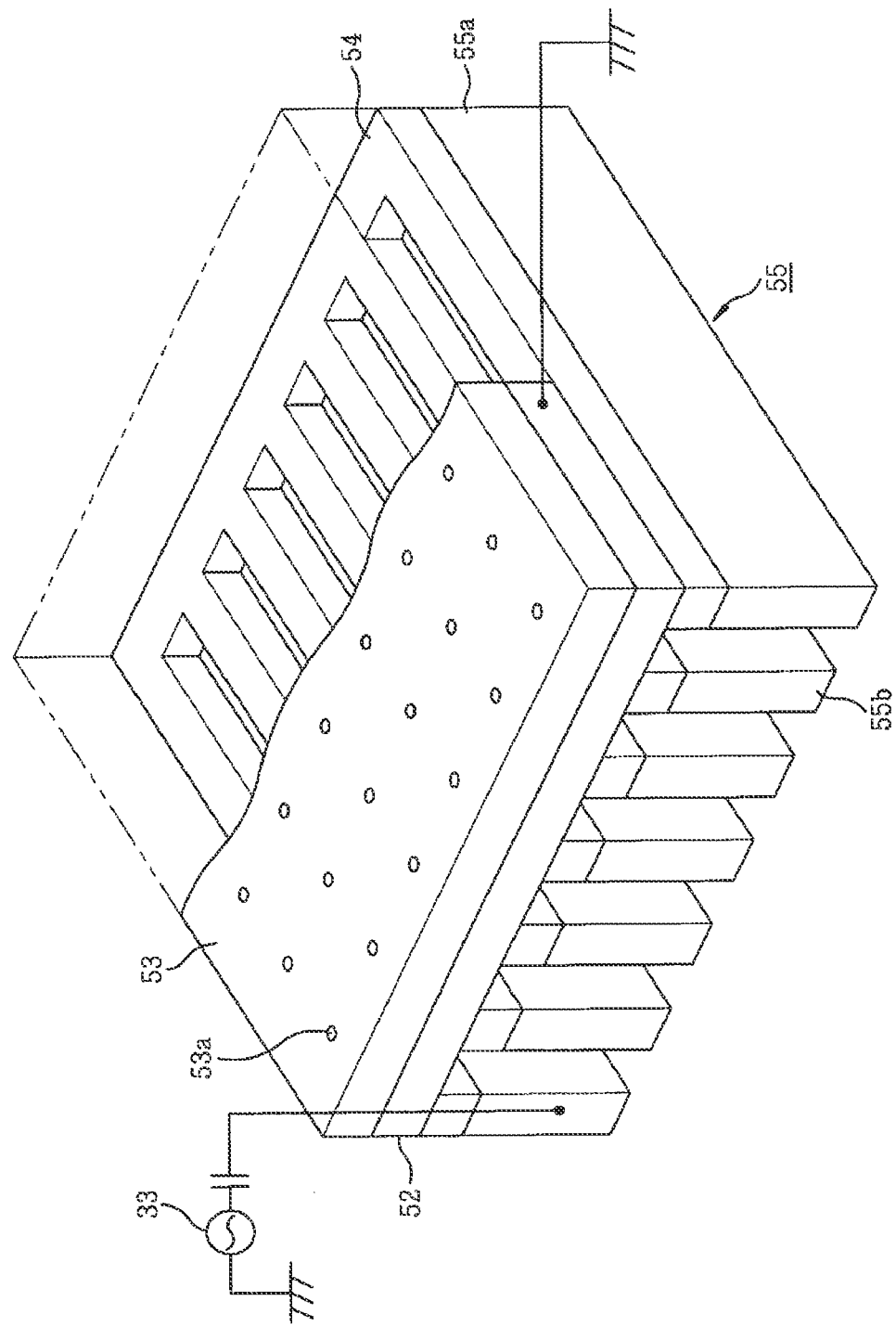
FIG. 6 is a perspective view showing a configuration of electrodes included in the plasma etching apparatus of FIG. 5.

Under the gas shower head 52, the comb electrode 55 is provided via an insulator 54. FIG. 6 is a perspective view of the insulators 54 and the comb electrode 55. Reference numerals 55a, 55b refer to a base and teeth of the comb electrode 55 respectively. A configuration of the comb electrode 55 is the same as that of the above-mentioned comb electrode 31 except for the number and thickness of the teeth 55b. Further, flow channels (not shown) for the cooling water as the temperature adjustment fluid are provided within the comb electrode 55 like the comb electrode 31. Thus, during the etching process, the cooling water flows through the flow channels to cool down the surfaces of the comb electrode 55. Moreover, the insulator 54 is made of, e.g. ceramic and has a comb shape matching with the comb electrode 55. Further, the processing gas G supplied from the gas shower head 52 flows toward the substrate B through spaces between the teeth of the insulator 54 and spaces between the teeth 55b of the comb electrode 55.

The operation of the plasma etching apparatus 51 is similar with that of the plasma etching apparatus 1. Specifically, the substrate B is transferred into the processing chamber 11.

Figure 7:
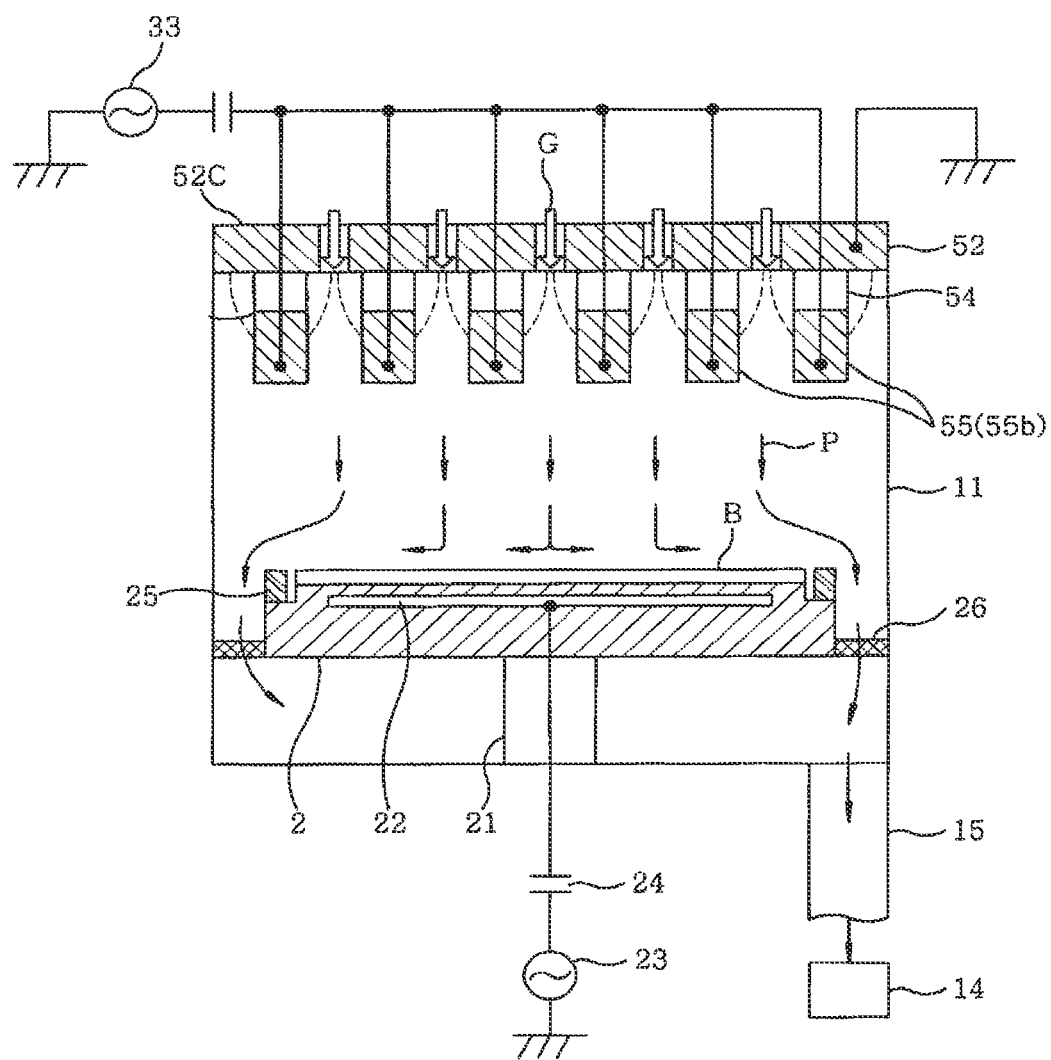
FIG. 7 describes the state in which the plasma etching apparatus of FIG. 5 performs the etching process.

Then, if the pressure of the inside of the processing chamber becomes a predetermined level, each processing gas G is supplied into the gas shower head 52 as shown by large arrows in FIG. 7 and, at the same time, the RF powers are applied from the RF power supply 23, 33 respectively. In this way, as shown in a dotted line of FIG. 7, the plasma P is generated between a lower surface of the gas shower head 52 and the teeth 55b of the comb electrode 55. Thereafter, ions in the plasma P are attracted toward the substrate B to etch the substrate B.

The etching apparatus 51 has the same effects and advantages as those of the above-mentioned etching apparatus 1. In addition, because the gas shower head 52 of the etching apparatus 51 is made of aluminum and is cooled down by the cooling water, the heat is not accumulated on the gas shower head 52 during the etching process and, hence, the influence of the heat on each substrate B is reliably suppressed, thereby suppressing variations of the processing between the substrates B.

Third Embodiment

Figure 8:
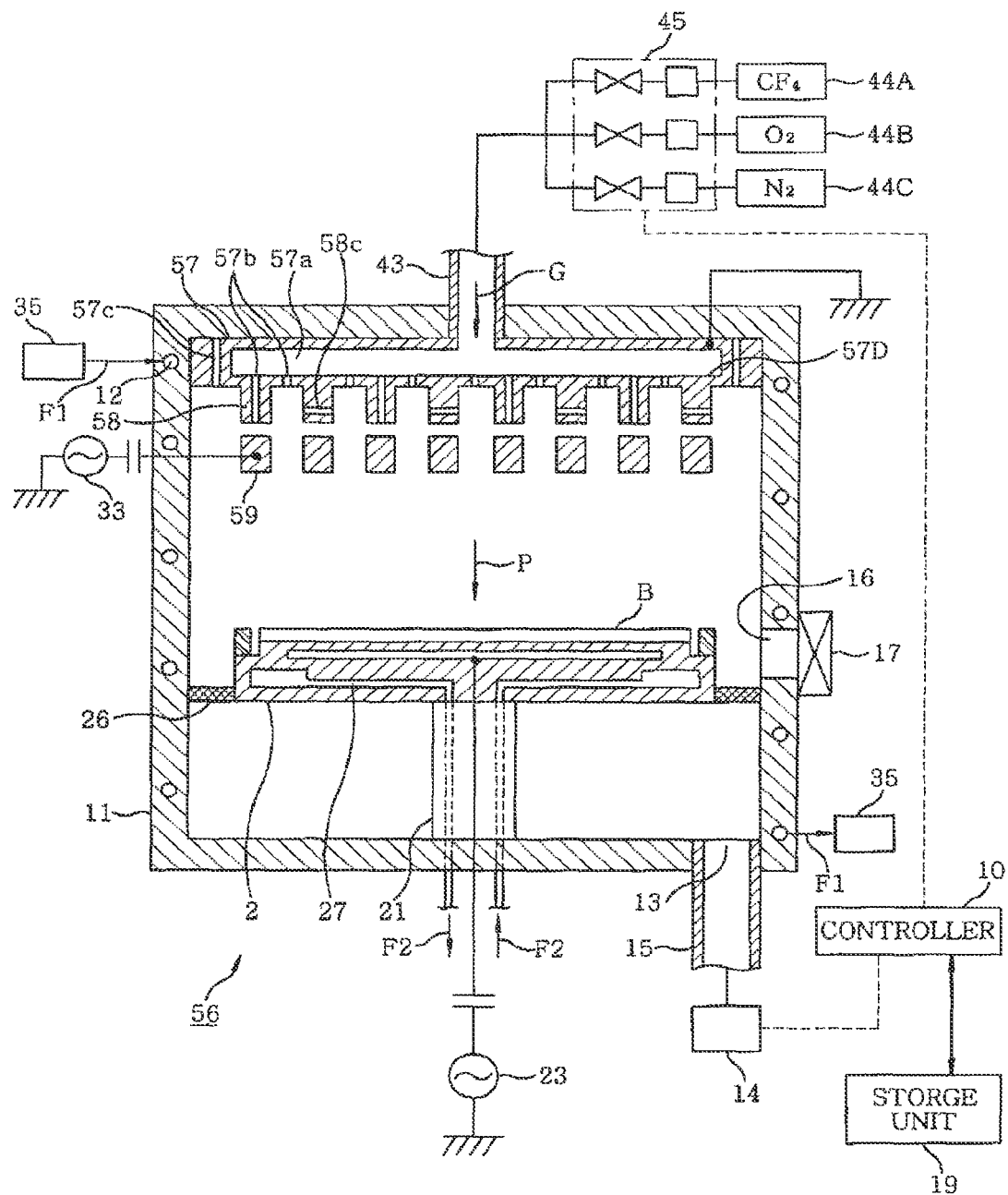
FIG. 8 is a vertical cross-sectional side view showing a plasma etching apparatus in accordance with still another embodiment of the present invention.
Figure 9:
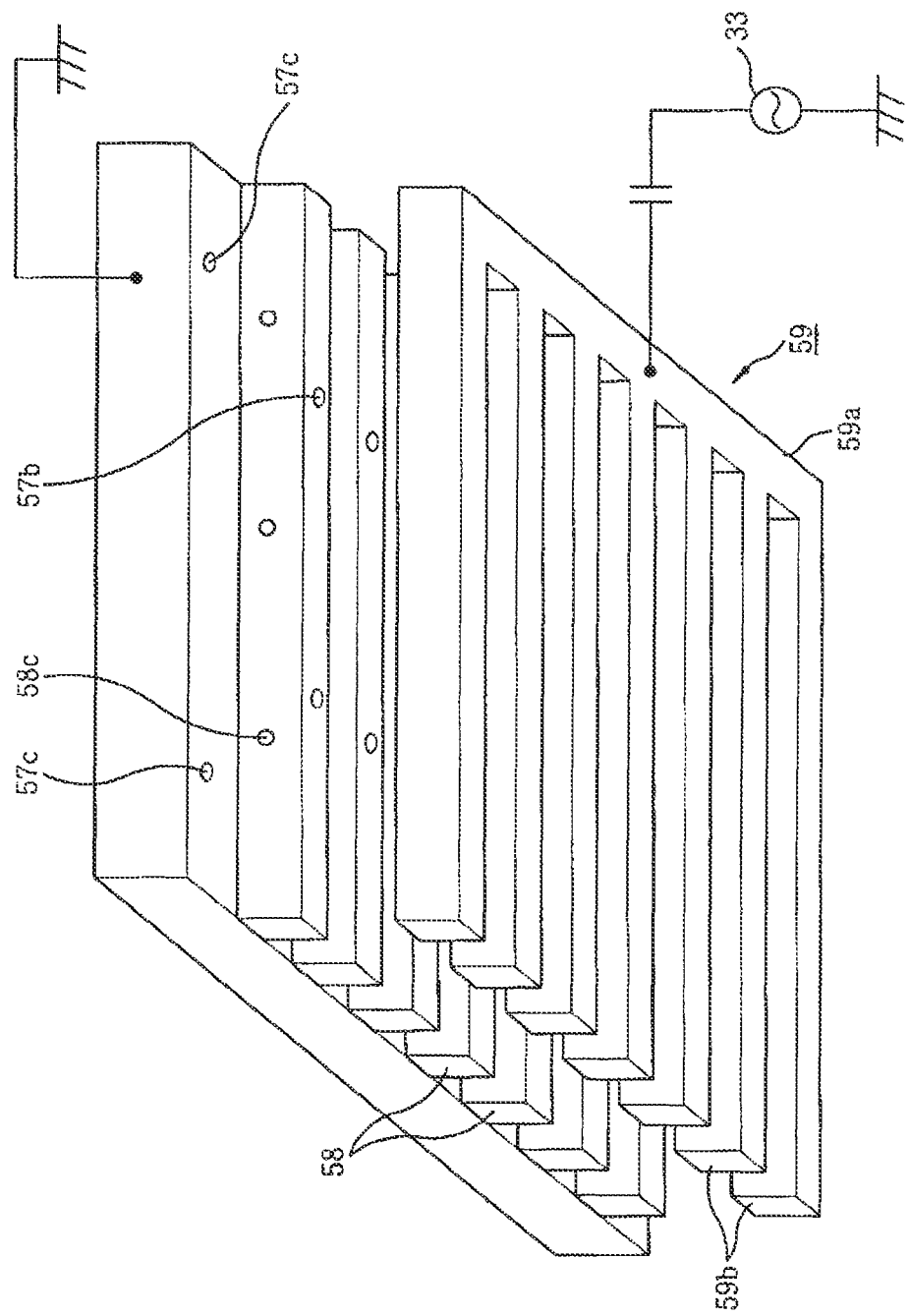
FIG. 9 is a perspective view showing a configuration of electrodes and a gas shower head included in the plasma etching apparatus of FIG. 8.

Following is a description of a plasma etching apparatus 56 in accordance with a still another embodiment as shown in FIG. 8. The plasma etching apparatus 56 includes a gas shower head 57 whose configuration will be explained with reference to FIG. 9.

The gas shower head 57 has a plate-type body 57D and is made of the same material as that of the gas shower head (gas supply unit) 52 of the second embodiment, e.g., aluminum. One of the first and second electrodes is formed as a part of the gas shower head (gas supply unit) 57 and the other is formed as a comb electrode 59 to be explained later. The gas shower head 57 is different from the gas shower head 52 in that a plurality of linear protrusions 58, which extend horizontally in parallel and spaced apart from each other, are arranged at a lower surface of the plate-type body 57D. Further, a plurality of gas supply holes 57b are formed in the lower surface of the plate-type body 57D between the linear protrusions 58 and in the lower surfaces of the linear protrusions 58 in a direction of thickness of the gas shower head 57 so as to communicate with a space 57a of the gas shower head 57 into which the processing gas G is supplied.

Here, an electric power applied to the gas shower head 57 serving as of the first or second electrode is high-frequency, therefore an electric current flows only at the surface of the electrode, thereby causing an electric potential difference between the surfaces of the gas shower head 57. For this reason, a plurality of holes 57c are formed in the periphery edge portion of a main body of the gas shower head 57 so as to penetrate through the gas shower head 57 in a direction of thickness thereof but not to communicate with the space 57a. In addition, a plurality of holes 58c are formed in the linear protrusions 58 so as to penetrate through the linear protrusions 58 horizontally but not to communicate with the gas supply holes 57b. Thus, the electric current flows at the surfaces of the holes 57c, 58c and, hence, the electric potential becomes uniform in the entire surfaces of the gas shower head 57. Further, for this reason, when a RF power is applied to the comb electrode 59 to be described later and the plasma P is generated between the gas shower head 57 and the comb electrode 59, a density of the generated plasma P becomes uniform. In view of this, holes having the same function as that of the holes 57c, 58c may be also made in the comb electrode 59 and, further, made in the first electrode and/or second electrode of the above-mentioned embodiments or embodiments which will be illustrated below.

The comb electrode 59 connected to a RF power supply 33 is installed under the gas shower head 57. The comb electrode 59 includes a base 59a and a plurality of teeth 59b which extend in parallel with each other horizontally from the base 59a. The base 59a of the comb electrode 59 is supported, for example, by an insulating member fixed onto an inner wall of the processing chamber 11 and the teeth 59b are arranged vertically opposite the respective linear protrusions 58 of the gas shower head 57. The comb electrode 59 is made of, e.g., the same material as that of the comb electrode 31.

Figure 10:
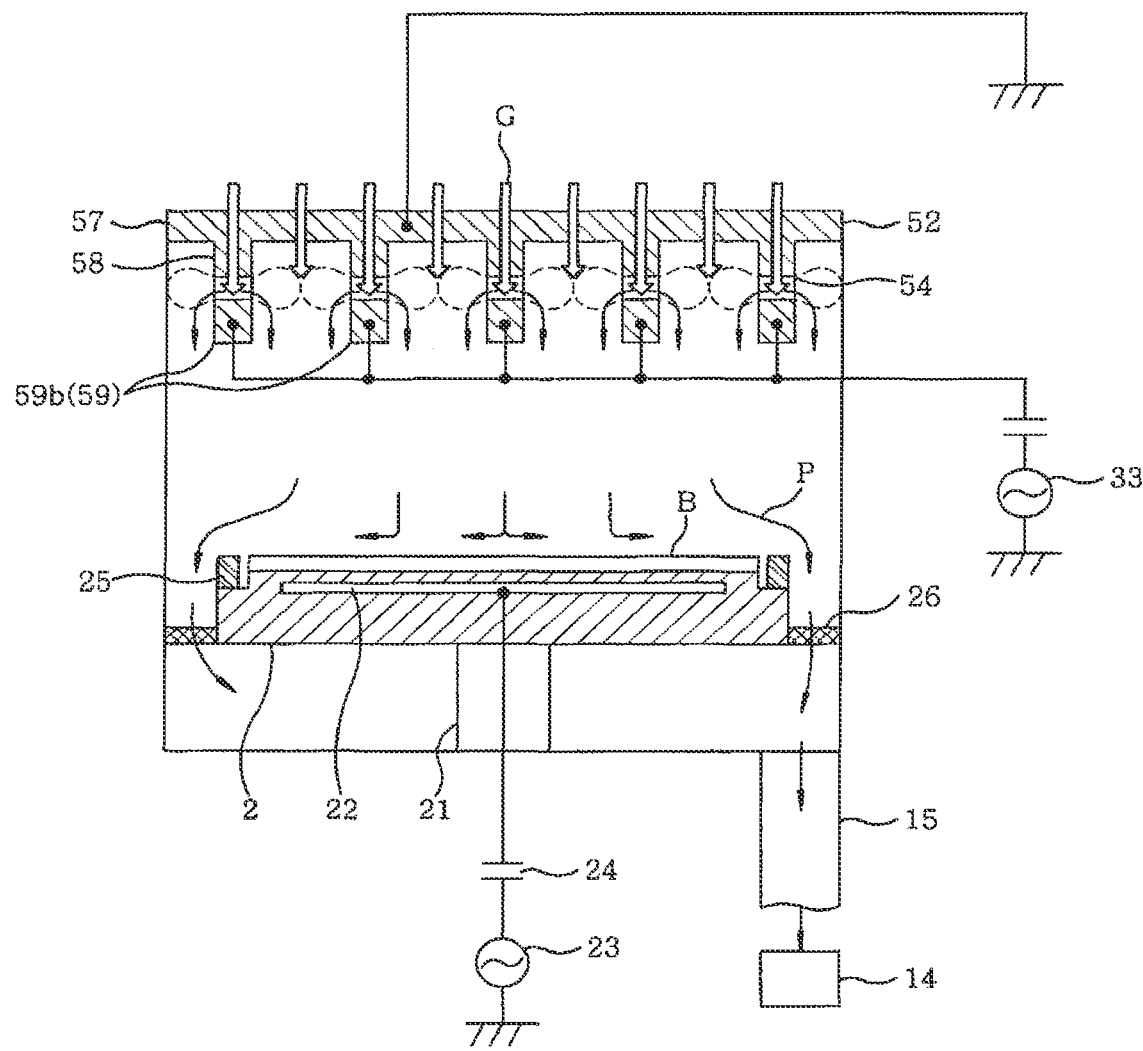
FIG. 10 describes the state in which the plasma etching apparatus of FIG. 8 performs the etching process.

The operation of the plasma etching apparatus 56 is similar with those of the above-mentioned plasma etching apparatuses. Specifically, when the RF powers are applied from the RF power supplies 23, 33 while supplying each processing gas G into the gas shower head 57, the plasma P is generated between the linear protrusions 58 of the gas shower head 57 and the teeth 59b of the comb electrode 59 as shown by a dotted line in FIG. 10. Thereafter, ions in the plasma P are attracted toward the substrate B to etch the substrate B. Meanwhile, the etching apparatus 56 has the same effects and advantages as those of the above-mentioned etching apparatus 1. In addition, the gas shower head 57 and the comb electrode 59 of the etching apparatus 56 are made of aluminum. In this way, except for a surface coating, no member made of a material having a higher heat-accumulation property such as the ceramic is installed in the processing space, so that the influence of the heat on the substrate B is suppressed. Moreover, flow channels of the cooling water as the temperature adjustment fluid may be provided within the comb electrode 59 as in the comb electrode 31, and the temperature adjustment plate 53 of the second embodiment may be installed in the space 57a of the gas shower head 57, thereby cooling down the comb electrode 59 and the gas shower head 57.

Fourth Embodiment

Following is a description of a plasma etching apparatus 6 for etching a circular type substrate, e.g., a wafer W. In this description, differences between this plasma etching apparatus 6 and the above-mentioned plasma etching apparatuses are mainly described with reference to FIG. 11. A processing chamber 61 of the plasma etching apparatus 6 has a cylinder shape and a mounting table 62 for mounting thereon the wafer W has a circular shape. Moreover, the gas shower head (gas supply unit) 63 has the same configuration as that of the gas shower head 4 of the above-mentioned first embodiment except that the former has a circular shape so as to match with the shape of the processing chamber 61. In addition, a plurality of gas supply holes 63b communicating with an inner space 63a of the gas shower head 63 are provided in a lower plate of the gas shower head 63 to supply the processing gas G into between the electrodes to be described later.

Figure 12:
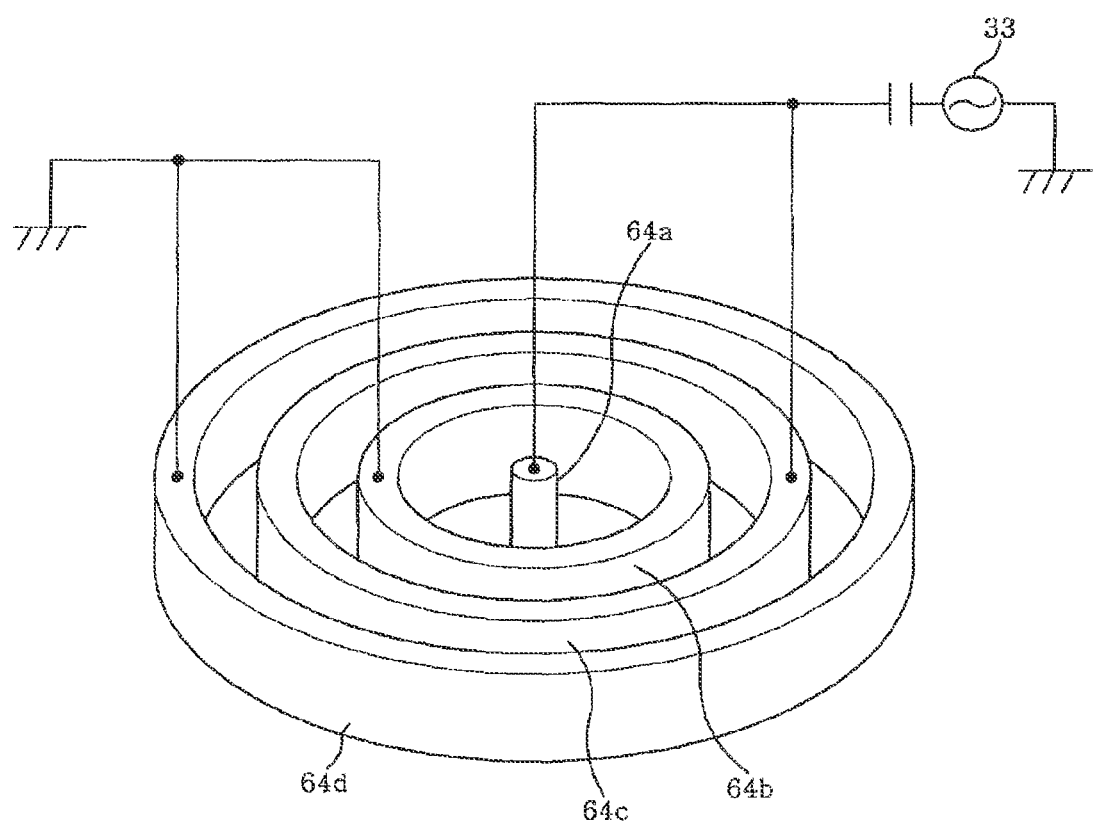
FIG. 12 is a perspective view showing a configuration of electrodes included in the plasma etching apparatus of FIG. 11.

The gas shower head 63 includes a plate-type body 63C, and, under the plate-type body 63C, a group of electrodes is provided as shown in FIG. 12. The group of electrodes includes, e.g., an electrode 64a installed in a center axis of the mounting table 62 and ring-shape electrodes 64b to 64d which are spaced each other and disposed concentrically around the electrode 64a. Further, the electrodes 64a, 64c are connected to a RF power supply 33, while the electrodes 64b, 64d are connected to ground. The electrodes 64a, 64c correspond to one of the first and second electrodes and the electrodes 64b, 64d correspond to the other. Each of the electrodes 64a to 64d is made of, e.g., the same material as that of the comb electrode 31.

Figure 11:
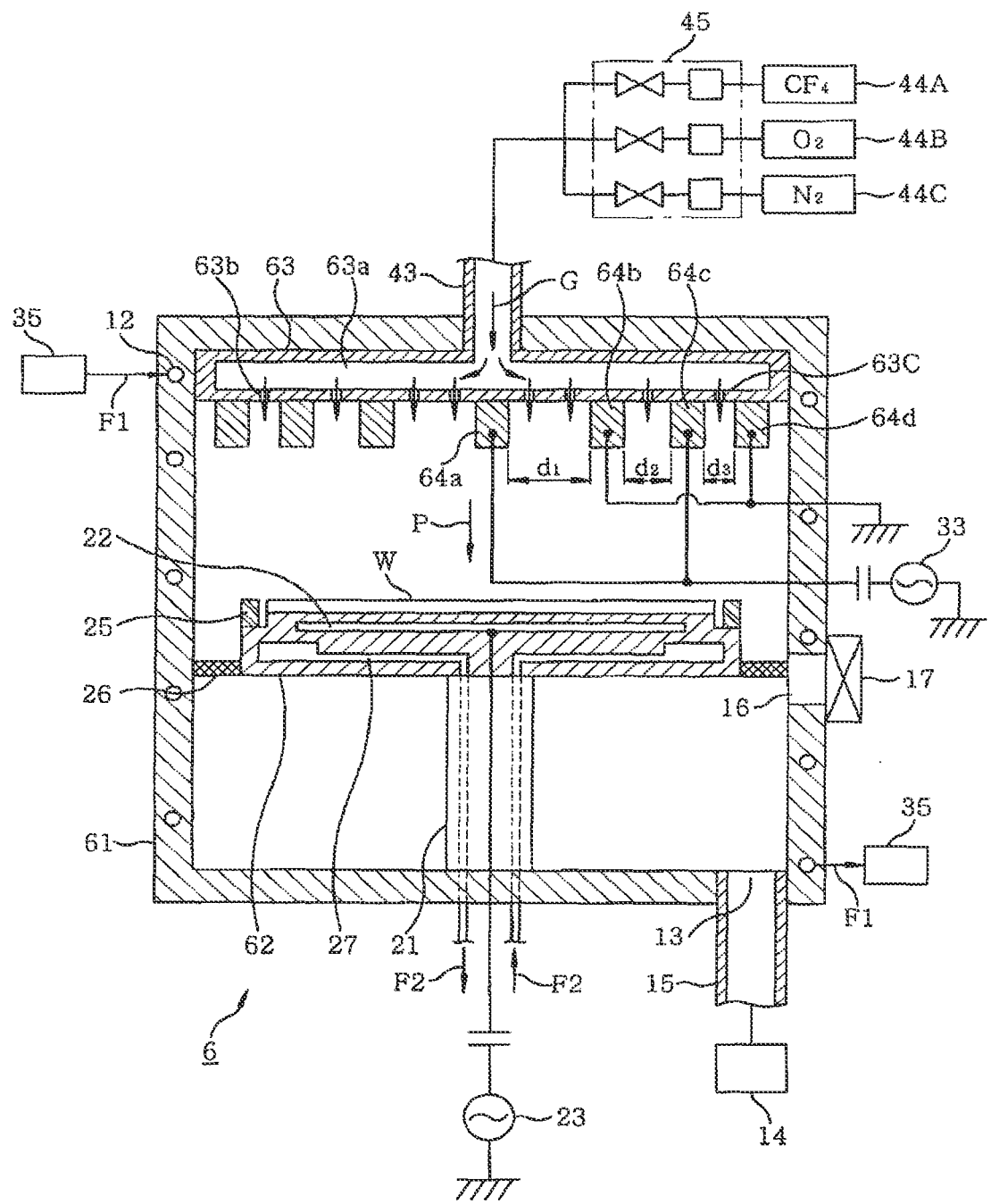
FIG. 11 is a vertical cross-sectional side view showing a plasma etching apparatus in accordance with still another embodiment of the present invention.

The operation of the plasma etching apparatus 6 is similar with those of the above-mentioned plasma etching apparatuses. Specifically, the wafer W is transferred into the processing chamber and a plasma p is generated between the electrodes 64a to 64d to etch the wafer W. Further, a circumference length of the wafer W gets larger as it goes away from the center of the wafer. Accordingly, in order to make an electric field level distribution in a radial direction of the wafer W uniform, the distance between the neighboring ring-shape electrodes 64b to 64d gets smaller as it goes away from the center of the wafer. In other words, as shown in FIG. 11, when the distance between the electrodes 64a and 64b, the distance between the electrodes 64b and 64c, and the distance between the electrodes 64c and 64d are respectively represented by $d_1$, $d_2$, and $d_3$, a relationship between $d_1$, $d_2$, and $d_3$ becomes $d_1 > d_2 > d_3$. In this way, a plasma density distribution in the radial direction of the wafer W becomes uniform. Meanwhile, the etching apparatus 6 has the same effects and advantages as those of the above-mentioned etching apparatus 1.

Fifth Embodiment

Figure 13:
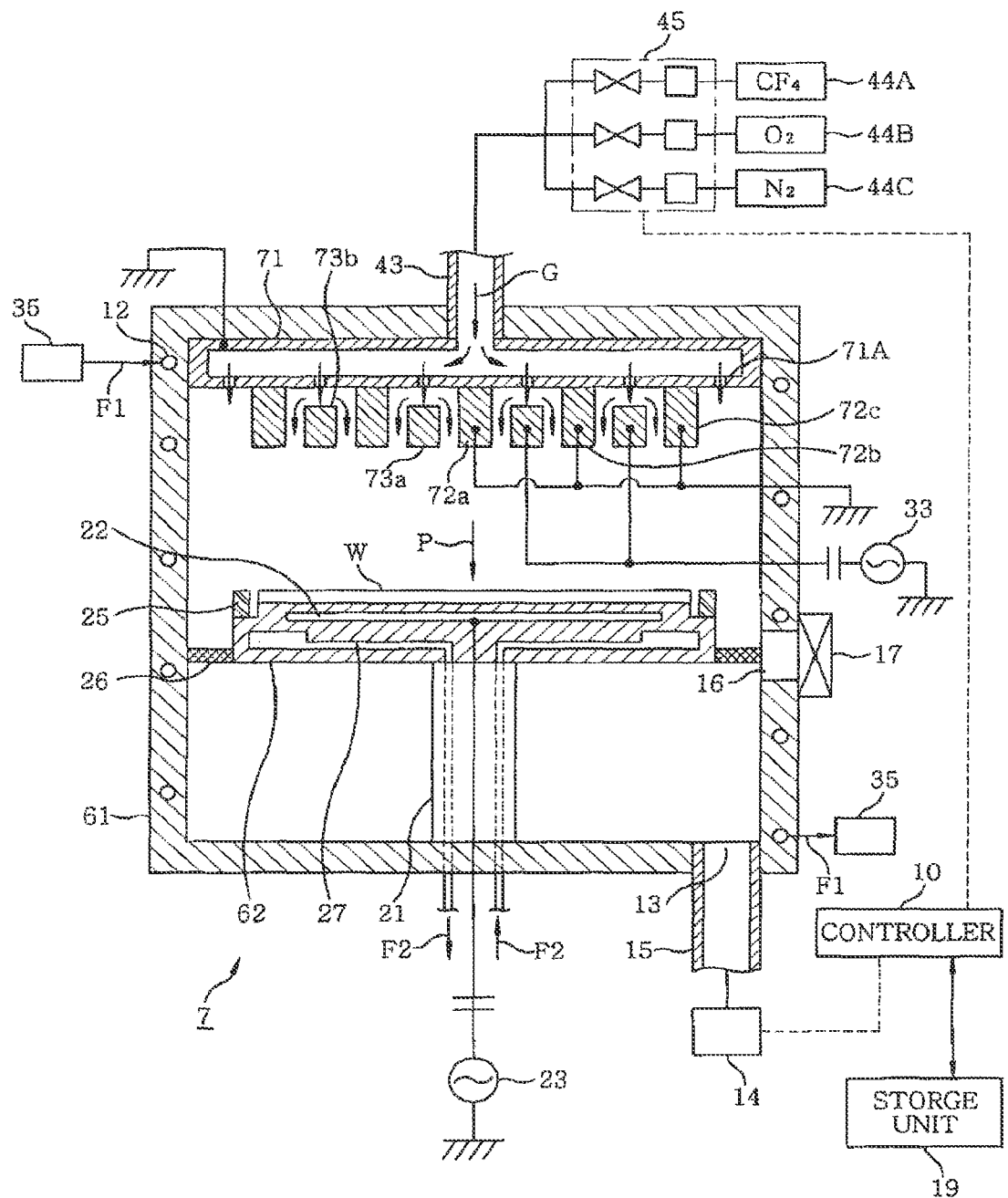
FIG. 13 is a vertical cross-sectional side view showing a plasma etching apparatus in accordance with still another embodiment of the present invention.

FIG. 13 depicts another embodiment of the plasma etching apparatus for etching a wafer W. The gas shower head 71 of this plasma etching apparatus 7 has a circular shape so as to match with the shape of the processing chamber 61. Further, a protrusion 72a is formed at the lower surface of a plate-type body 71A of the gas shower head 71 in the center axis of the mounting table 62. In addition, ring-shaped protrusions 72b, 72c which are spaced each other and disposed concentrically around the protrusion 72a are formed at the lower surface of the plate-type body 71A of the gas shower head 71. Further, ring-shape members 73a, 73b serving as the electrodes are formed between the protrusions 72a and 72b, and between the protrusions 72b and 72c respectively.

Figure 14:
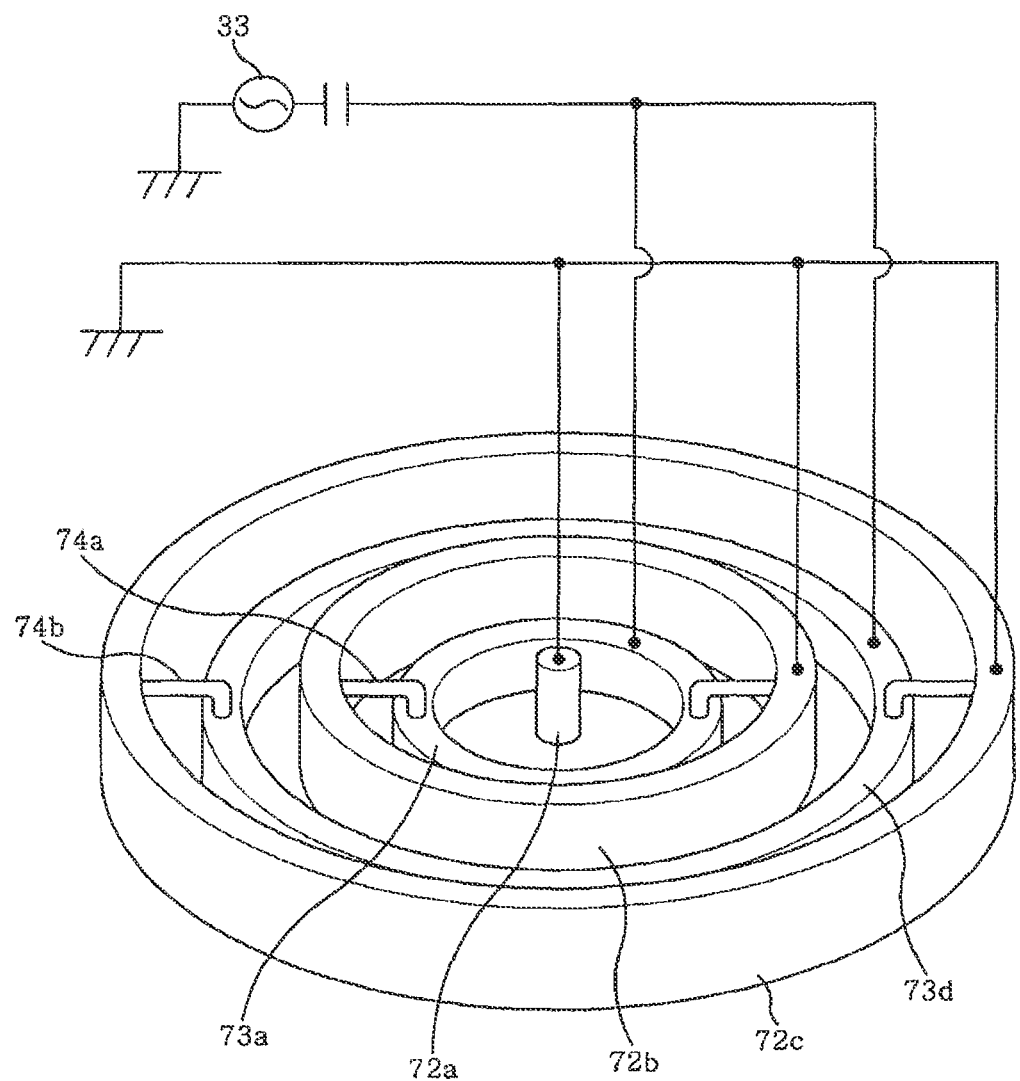
FIG. 14 is a perspective view showing a configuration of electrode included in the plasma etching apparatus of FIG. 13.

FIG. 14 shows a configuration of the protrusions 72a to 72c and the ring-shape members 73a, 73b. The ring-shape members 73a, 73b are supported by the protrusions 72b, 72c respectively through supporting members 74a, 74b made of, e.g., an insulating material such as ceramic. That is, this embodiment has the modified configuration of the fourth embodiment in that one of the set of the ring-shape electrodes 64a, 64c and the set of the ring-shape electrode 64b, 64d in the fourth embodiment is formed at the lower surface of the gas shower head 71 to have the same electric potential as that of the gas shower head 71. Therefore, the protrusions 72a to 72c and the gas shower head 71 correspond to one of the first and second electrodes, while the ring-shape members 73a, 73b correspond to the other one. For example, the protrusions 72a to 72c are connected to ground and the ring-shape members 73a, 73b are connected to the RF power supply 33.

Further, in the first embodiment for the rectangular type substrate, one of a group of the teeth 32b of the comb electrode 32 as rod-shaped members corresponding to the first electrode and a group of the teeth 31b of the comb electrode 31 as rod-shaped members corresponding to the second electrode may be formed at the lower surface of the gas shower head 4 as in FIG. 13 and the gas shower head 4 may be made of metal. In this case, an electric potential of one of two groups of the teeth 31b, 32b may be same as that of the gas shower head 4 as in the fifth embodiment.

Sixth Embodiment

Figure 15:
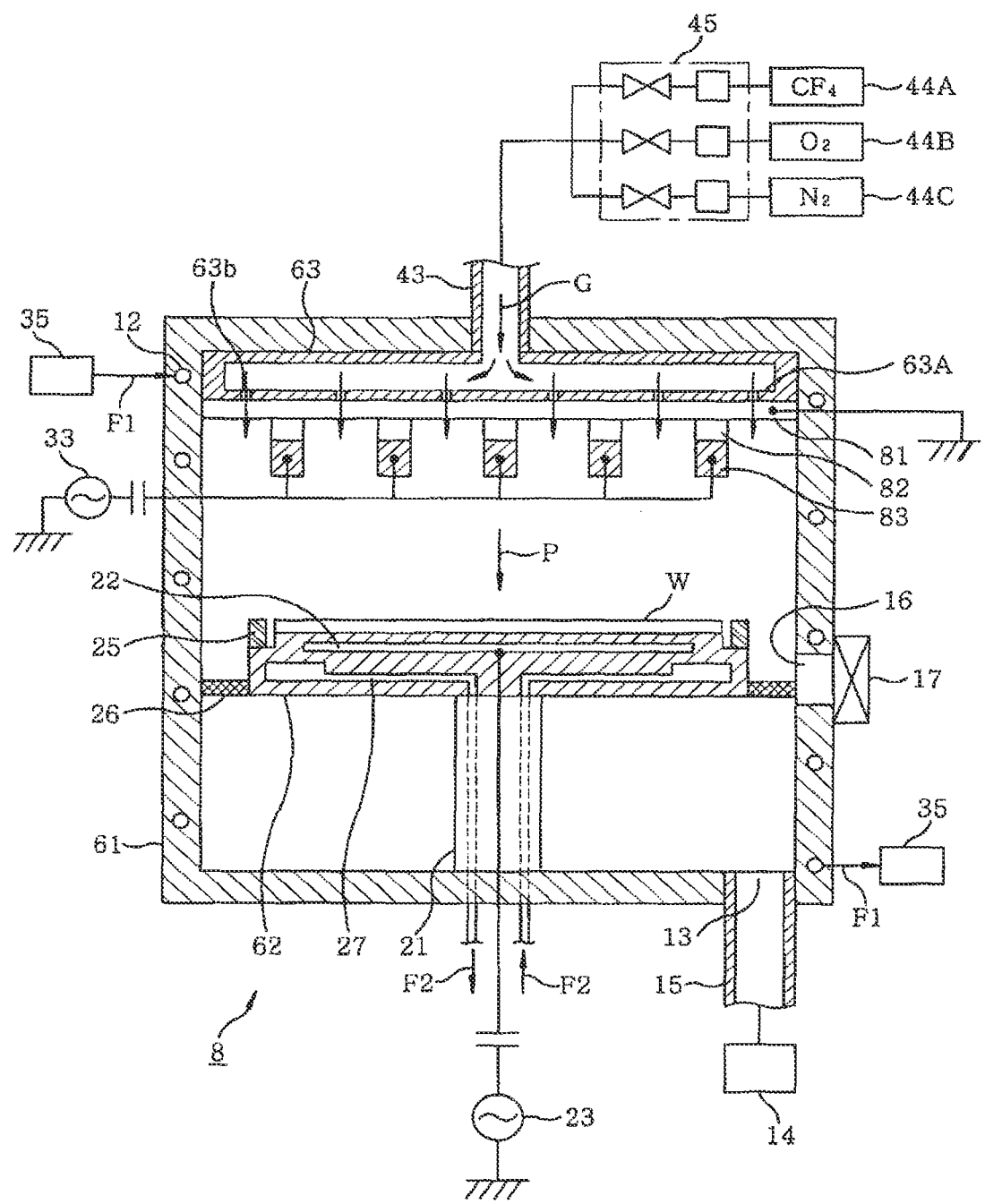
FIG. 15 is a vertical cross-sectional side view showing a plasma etching apparatus in accordance with a still another embodiment of the present invention.
Figure 16:
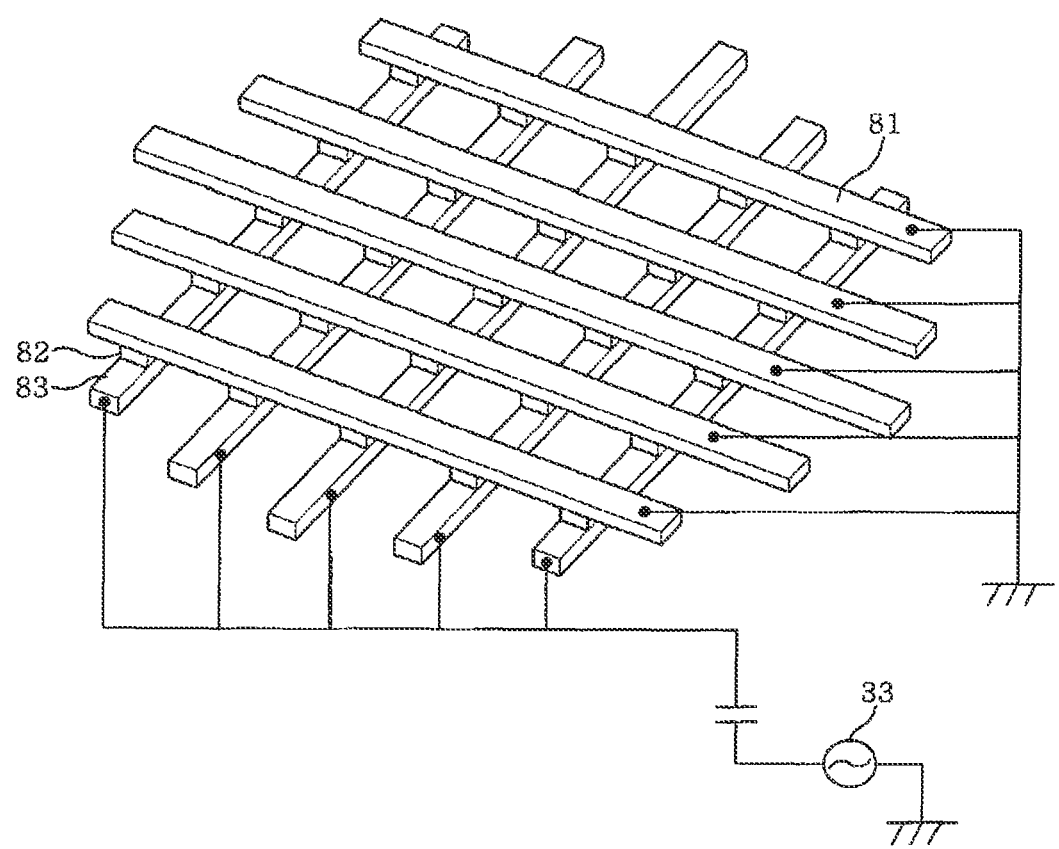
FIG. 16 is a perspective view showing a configuration of electrodes included in the plasma etching apparatus of FIG. 15.
Figure 17:
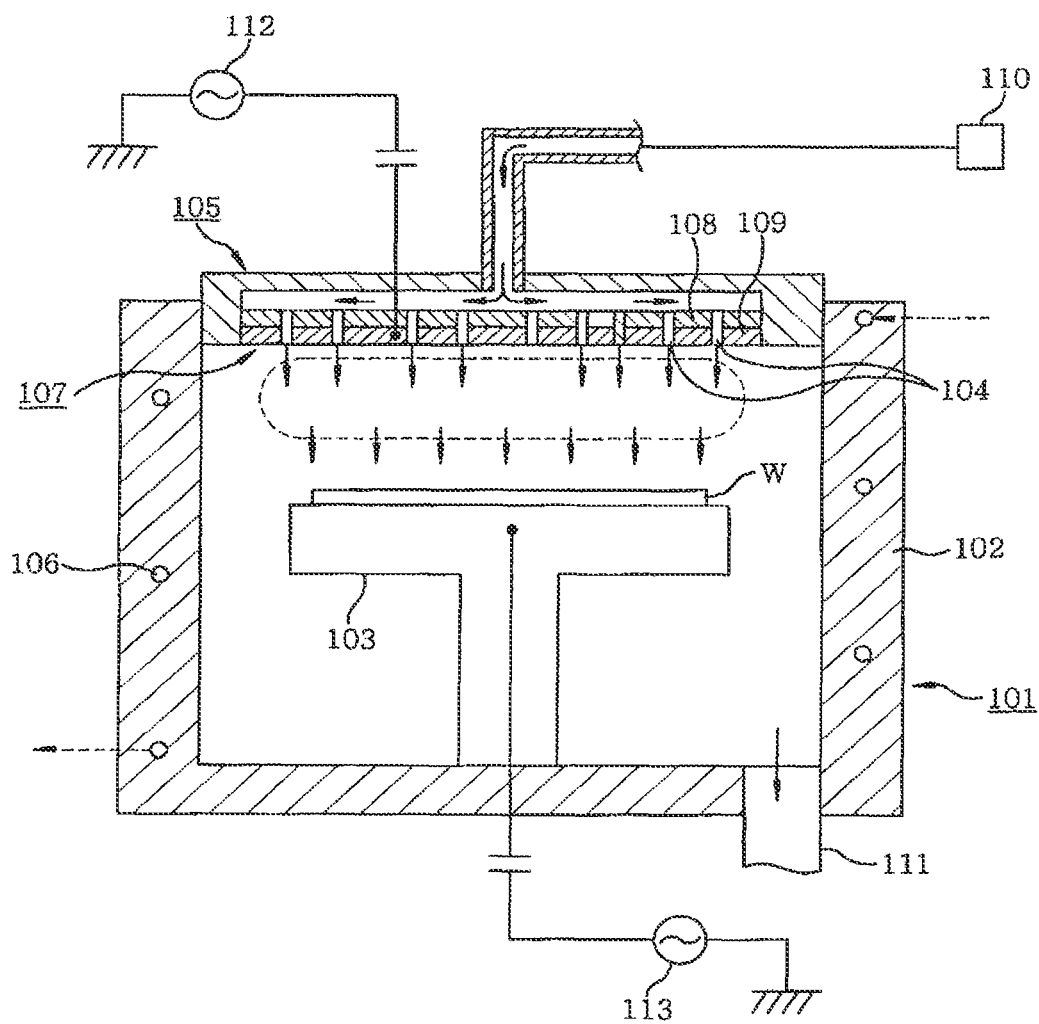
FIG. 17 is a vertical cross-sectional side view showing a conventional plasma etching apparatus.
Figure 18:
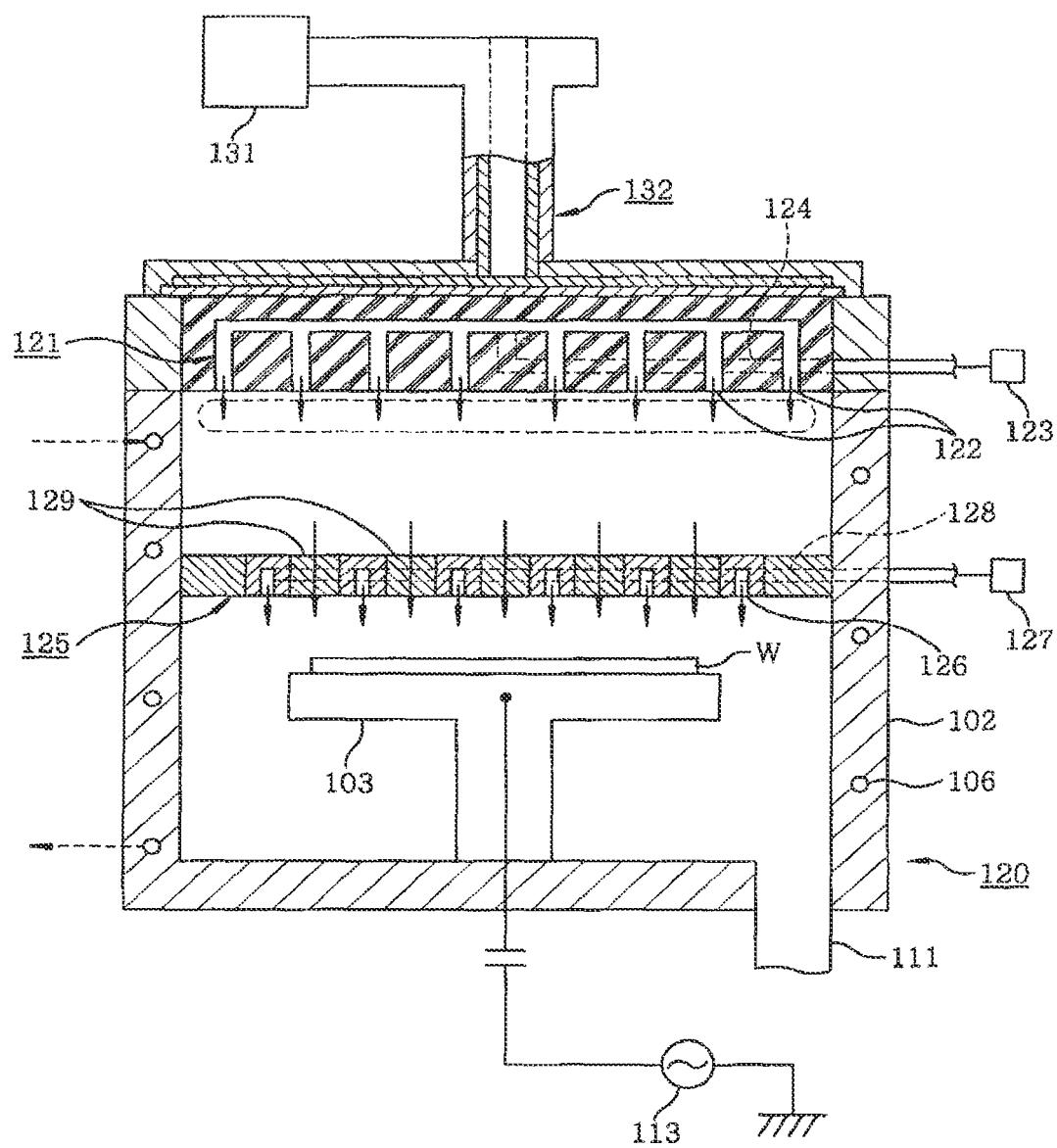
FIG. 18 is a vertical cross-sectional side view showing another conventional plasma etching apparatus.
Figure 19A:
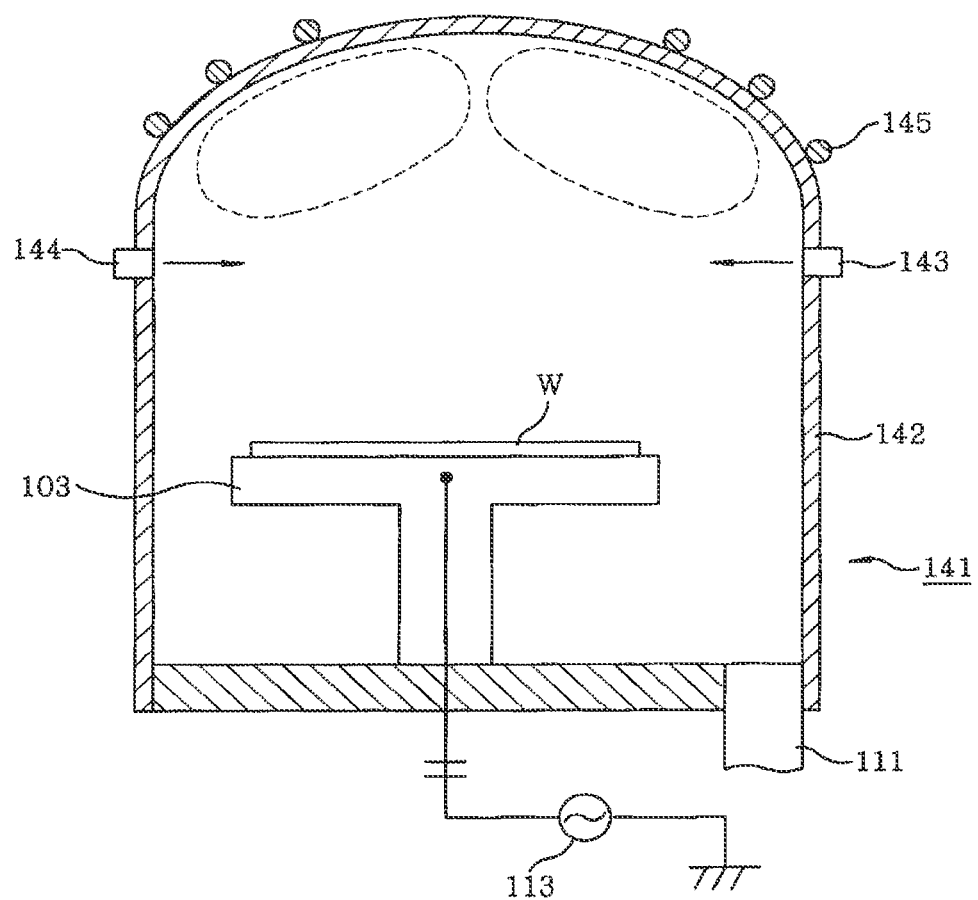
FIGS. 19A and 19B are a vertical cross-sectional side view and a perspective view showing still another conventional plasma etching apparatus.
Figure 19B:
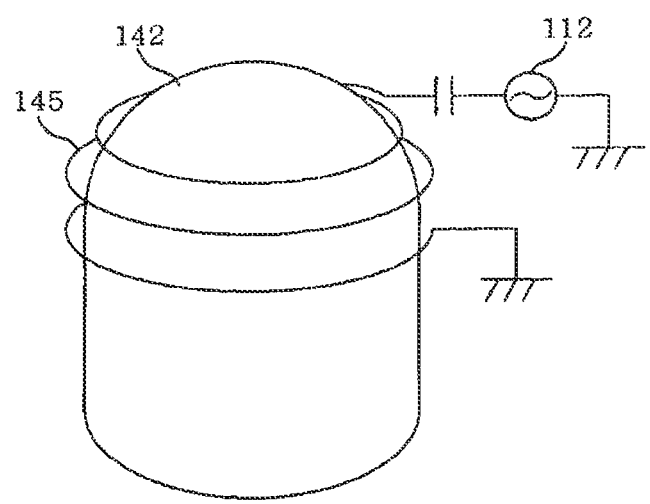

A plasma etching apparatus may be configured as in FIG. 15. The configuration of the etching apparatus 8 in FIG. 15 is the same as that of the etching apparatus 6 of the fourth embodiment in FIG. 11 except for the configuration of the electrodes. FIG. 16 is a perspective view of the electrodes where a plurality of rod-shaped electrodes 81 extends horizontally in parallel with each other under a plate-type body 63A of a gas shower head 63. Further, under the electrodes 81, a plurality of rod-shaped parallel electrodes 83 extend in a perpendicular direction to the extending direction of the electrodes 81, with insulating members 82 being interposed between the electrodes 81, 83. In this way, the electrodes 81, 83 are arranged to form a lattice pattern. The processing gas is supplied from gas supply holes 63b of the gas shower head 63 through spaces between the electrodes to generate the plasma P.

In each of the above-mentioned embodiments, among the first and second electrodes, the electrode connected to a ground and the electrode connected to the plasma generating RF power supply 33 may be exchanged. Moreover, other well-known etching gases than the above-mentioned etching gases may be used. Further, the plasma processing apparatus in accordance with the present invention may be applied not only to the etching apparatus but also to a CVD apparatus, a sputtering apparatus or the like using the plasma.

What is claimed is:

1. A plasma processing method using a processing apparatus having a processing chamber for processing a substrate by a plasma of a processing gas, the method comprising:
    mounting the substrate onto a mounting table provided in a lower portion of the processing chamber;
    supplying the processing gas between a first electrode and a second electrode provided in an upper portion of the processing chamber, wherein the first electrode has a first plurality of linear members horizontally extending in parallel with each other and the second electrode has a second plurality of linear members horizontally extending in parallel with each other, the first plurality of linear members being arranged in a one-to-one corresponding manner with the second plurality of linear members and each of the first plurality of linear members being vertically opposite the corresponding one of the second plurality of linear members;
    applying an RF power between the first electrode and the second electrode so that the processing gas supplied between the first electrode and second electrode is converted to the plasma of the processing gas; and
    exhausting the inside of the processing chamber from a lower portion of the processing chamber to a vacuum level.

2. The plasma processing method of claim 1, wherein the processing gas is supplied between the first electrode and second electrode through a plurality of gas supply holes formed through a plate-shaped body that is located above the first electrode and second electrode.

3. The plasma processing method of claim 1, wherein said applying the RF power between the first electrode and the second electrode includes applying the RF power to the second electrode with the first electrode grounded.

4. The plasma processing method of claim 1, wherein the first electrode is disposed above the second electrode.

* * * * *